(12) United States Patent
Yang

(10) Patent No.: US 12,094,814 B2
(45) Date of Patent: Sep. 17, 2024

(54) MEMORY DEVICE AND FLASH MEMORY DEVICE WITH IMPROVED SUPPORT FOR STAIRCASE REGIONS

(71) Applicant: MACRONIX International Co., Ltd., Hsinchu (TW)

(72) Inventor: Chin-Cheng Yang, Kaohsiung (TW)

(73) Assignee: MACRONIX International Co., Ltd., Hsinchu (TW)

( * ) Notice: Subject to any disclaimer, the term of this patent is extended or adjusted under 35 U.S.C. 154(b) by 591 days.

(21) Appl. No.: 17/350,936

(22) Filed: Jun. 17, 2021

(65) Prior Publication Data

US 2022/0406709 A1 Dec. 22, 2022

(51) Int. Cl.
*H01L 23/522* (2006.01)
*H01L 23/48* (2006.01)
(Continued)

(52) U.S. Cl.
CPC ........ *H01L 23/5226* (2013.01); *H01L 23/481* (2013.01); *H01L 23/5283* (2013.01);
(Continued)

(58) Field of Classification Search
CPC ........ H10B 69/00; H10B 53/00; H10B 53/10; H10B 53/20; H10B 53/30; H10B 53/40; H10B 53/50; H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10; H10B 43/20; H10B 43/23; H10B 43/27;
(Continued)

(56) References Cited

U.S. PATENT DOCUMENTS 11,081,524 B2  8/2021  Hua et al.
11,094,708 B2  8/2021  Park et al.
(Continued)

FOREIGN PATENT DOCUMENTS

CN  110943090  3/2020
TW  I619217  3/2018
(Continued)

OTHER PUBLICATIONS

"Office Action of Taiwan Counterpart Application", issued on Jan. 19, 2022, pp. 1-3.

*Primary Examiner* — Didarul A Mazumder
*Assistant Examiner* — Gustavo G Ramallo
(74) *Attorney, Agent, or Firm* — J.C. PATENTS

(57) ABSTRACT

A memory device includes a staircase structure, multiple first plugs, multiple second plugs, and multiple third plugs. The staircase structure includes multiple gate layers and multiple insulating layers alternately stacked on each other, and the staircase structure includes multiple first blocks and multiple second blocks which alternate with each other. The first plugs are disposed in the first blocks, and the first plugs in a same first block are staggered with each other. The second plugs are disposed in the first blocks. The second plugs in a same first block are staggered with each other, and the first plugs and the second plugs in a same first block are staggered with each other. The third plugs are disposed in the second blocks.

20 Claims, 31 Drawing Sheets

(51) Int. Cl.
    *H01L 23/528*   (2006.01)
    *H10B 43/10*    (2023.01)
    *H10B 43/27*    (2023.01)
    *H10B 43/35*    (2023.01)
(52) U.S. Cl.
    CPC ............ *H10B 43/10* (2023.02); *H10B 43/27*
        (2023.02); *H10B 43/35* (2023.02)
(58) Field of Classification Search
    CPC ........ H10B 43/30; H10B 43/35; H10B 43/40;
        H10B 43/50; H10B 51/00; H10B 51/10;
        H10B 51/20; H10B 51/30; H10B 51/40;
        H10B 51/50
    See application file for complete search history.

(56) References Cited

U.S. PATENT DOCUMENTS

| | | | |
|---|---|---|---|
| 11,631,687 B2 * | 4/2023 | Suzuki | H10B 43/10 |
| | | | 257/324 |
| 2017/0229577 A1 * | 8/2017 | Matsuura | H10B 43/10 |
| 2019/0035804 A1 * | 1/2019 | Kim | H10B 43/35 |
| 2019/0198523 A1 * | 6/2019 | Nakanishi | H10B 43/50 |
| 2020/0098786 A1 | 3/2020 | Park et al. | |
| 2020/0286958 A1 | 9/2020 | Hua et al. | |
| 2024/0113020 A1 * | 4/2024 | Kwon | H10B 43/40 |

FOREIGN PATENT DOCUMENTS

| | | |
|---|---|---|
| TW | I692018 | 4/2020 |
| TW | I701813 | 8/2020 |

\* cited by examiner

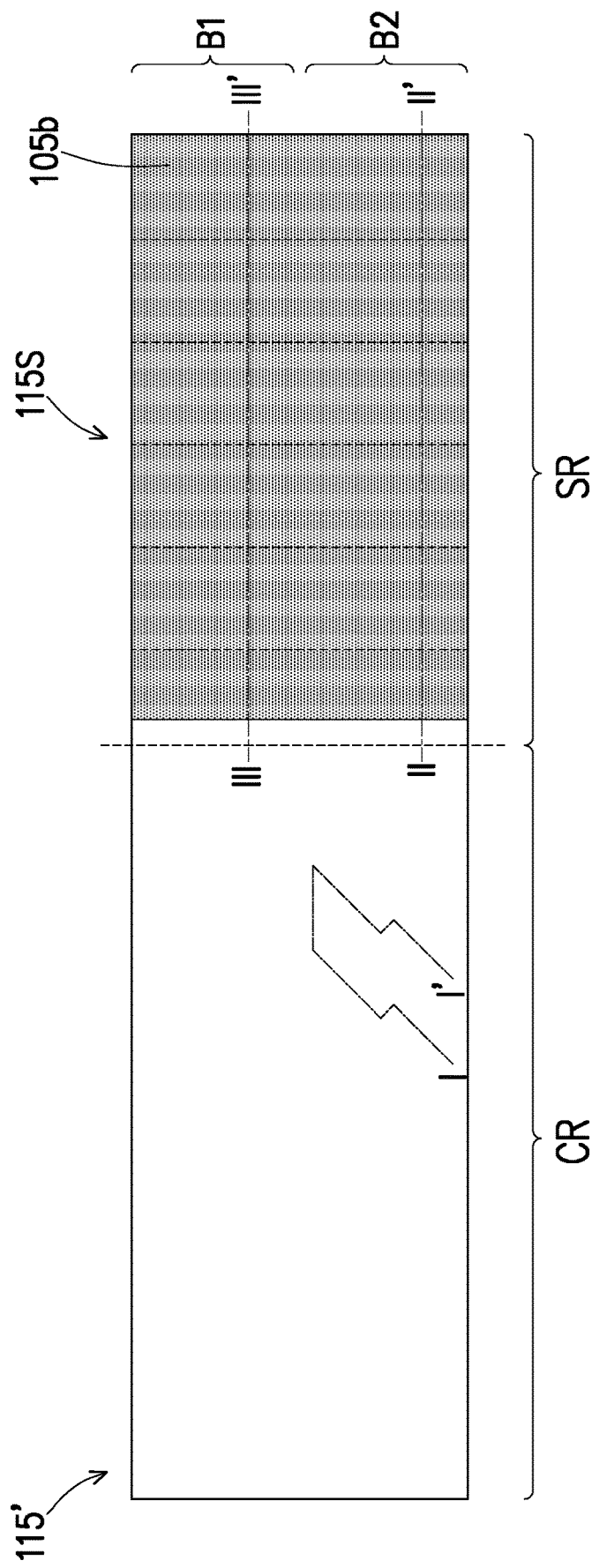

MEMORY DEVICE AND FLASH MEMORY DEVICE WITH IMPROVED SUPPORT FOR STAIRCASE REGIONS

BACKGROUND

Technical Field

The embodiment of the disclosure relates to a semiconductor device and a manufacturing method thereof, and particularly, to a flash memory device and a manufacturing method thereof.

Description of Related Art

Since a non-volatile memory device has the advantage that stored data does not disappear at power-off, it becomes a widely used memory device for a personal computer or other electronics equipment. Currently, the three-dimensional memory commonly used in the industry includes a NOR memory and a NAND memory. In addition, another type of three-dimensional memory is an AND memory, which can be applied to a multi-dimensional memory array with high integration and high area utilization, and has an advantage of a fast operation speed. Therefore, the development of a three-dimensional memory has gradually become the current trend.

SUMMARY

According to an embodiment of the disclosure, a memory device includes a staircase structure, multiple first plugs, multiple second plugs, and multiple third plugs. The staircase structure includes multiple gate layers and multiple insulating layers alternately stacked on each other, and the staircase structure includes multiple first blocks and multiple second blocks which alternate with each other. The first plugs are disposed in the first blocks, and the first plugs in a same first block are staggered with each other. The second plugs are disposed in the first blocks. The second plugs in a same first block are staggered with each other, and the first plugs and the second plugs in a same first block are staggered with each other. The third plugs are disposed in the second blocks.

According to an embodiment of the disclosure, a flash memory device includes a substrate, a stack structure, multiple slits, multiple channel pillars, multiple charge storage layers, multiple pairs of conductive pillars, multiple first plugs, multiple second plugs, and multiple third plugs. The substrate includes a memory cell region and a staircase region. The stack structure is located on the substrate. The stack structure includes multiple gate layers and multiple insulating layers alternately stacked on each other. The stack structure includes a cell region and a staircase region, and the stack structure in the staircase region includes a staircase structure. The slits divide the staircase structure into multiple first blocks and multiple second blocks which alternate with each other. The channel pillars penetrate through the stack structure of the first blocks and the second blocks in the memory cell region. The charge storage layers are disposed between the channel pillars and the gate layers. Each of the pairs of conductive pillars includes a first conductive pillar and a second conductive pillar which are electrically insulated from each other and are disposed in each of the channel pillars. The first plugs are disposed in the first blocks, and the first plugs in a same first block are staggered with each other. The second plugs are disposed in the first blocks. The second plugs in a same first block are staggered with each other, and the first plugs and the second plugs in a same first block are staggered with each other. The third plugs are disposed in the second blocks.

Based on the above, in the embodiments of the disclosure, the contacts and the through-array vias in the dummy pillars within in the same block in the staircase region may be arranged in a staggered pattern, or the contacts and the dummy pillars in the same block in the staircase region may be arranged in a staggered pattern, so as to provide uniform support for the entire staircase structure. The dummy pillars or the through-array vias in the dummy pillars may be individually disposed in another block in the staircase region; the dummy pillars or the through-array vias in the dummy pillars may be arranged in a staggered pattern to provide uniform support for the entire staircase structure, or the radial dimension of the dummy pillars may be increased or the shape of the dummy pillars may be changed to improve the support effect for each stair.

BRIEF DESCRIPTION OF THE DRAWINGS

FIG. 5A to FIG. 5K are top views showing a manufacturing process of a memory device according to an embodiment of the disclosure.

DESCRIPTION OF THE EMBODIMENTS

Figure 1:
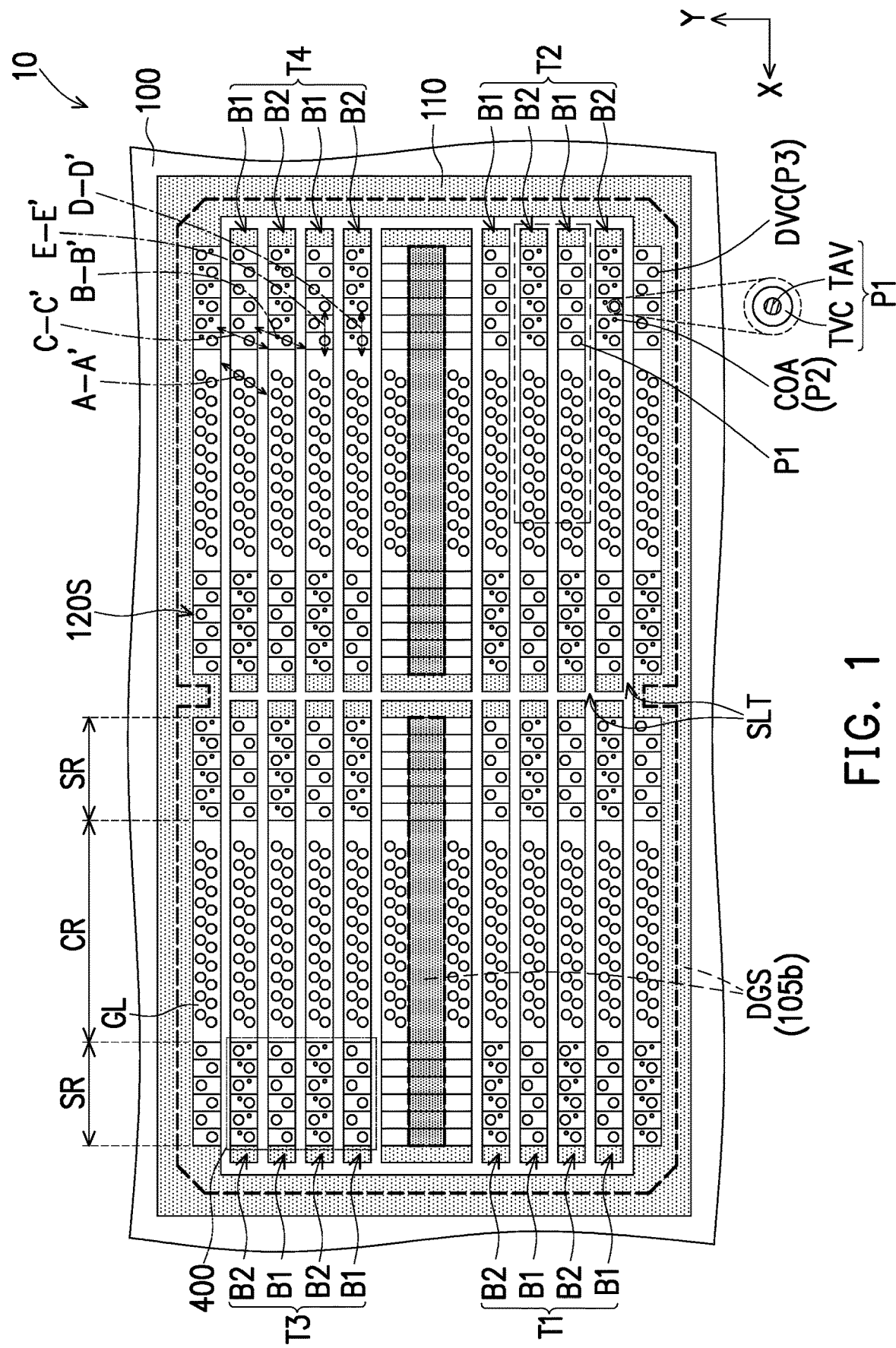
FIG. 1 is a top view of a three-dimensional memory device according to an embodiment of the disclosure.

Referring to FIG. 1, a three-dimensional memory device 10 may include multiple tiles T1 to T4, and each of the tiles T1 to T4 may include multiple blocks B1 and multiple blocks B2. FIG. 1 shows four tiles T1 to T4 and two blocks B1 and two blocks B2 included in each of the tiles T1 to T4 according to an exemplary embodiment. However, the number of the tiles and the number of the blocks included in each tile of the three-dimensional memory device 10 are not limited thereto.

Figure 2:
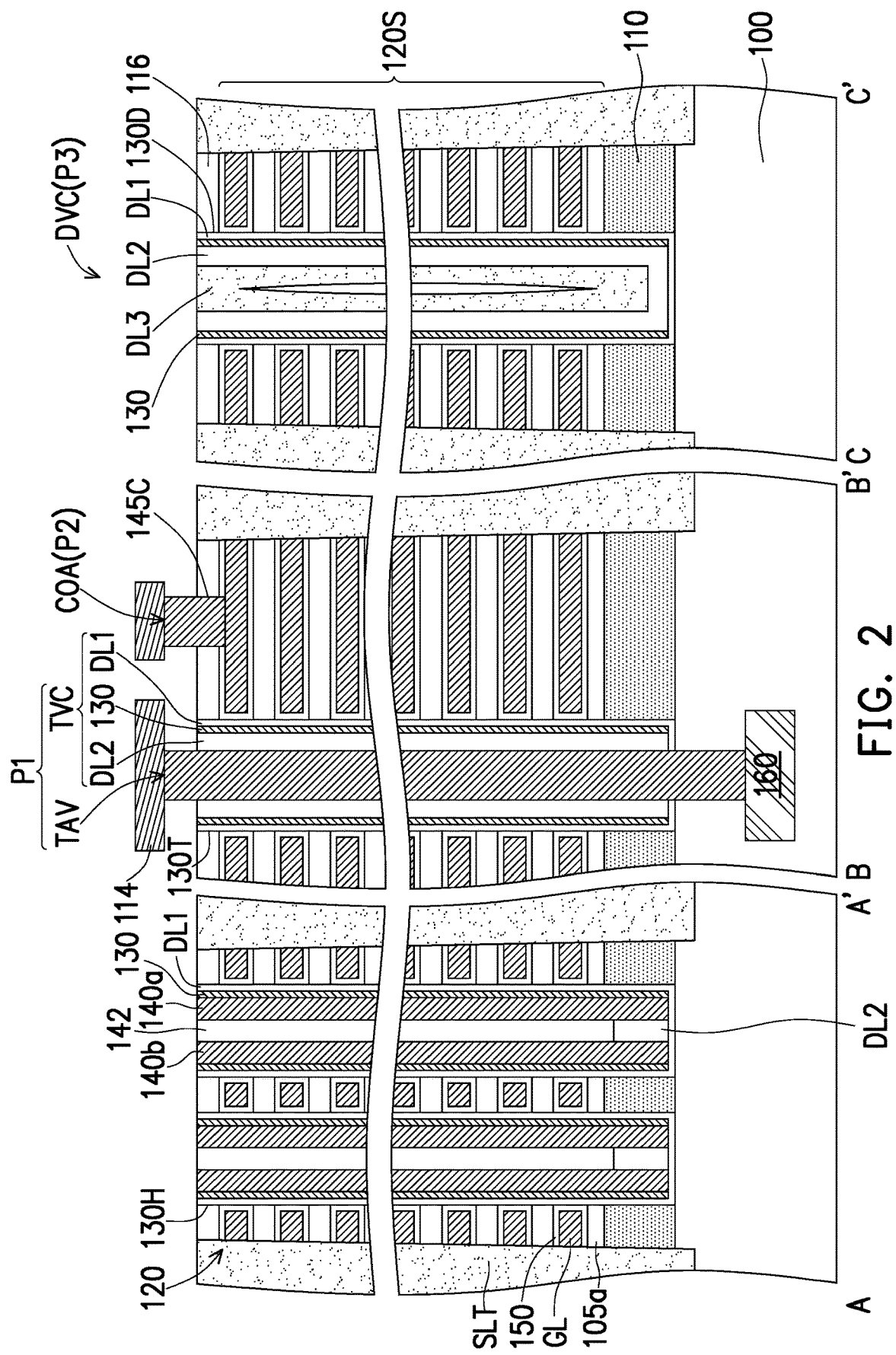
FIG. 2 is a schematic cross-sectional view taken along lines A-A', B-B', and C-C' in
FIG. 1.

Referring to FIG. 1 and FIG. 2, a slit SLT separates gate stack structures 120 in adjacent two of the blocks B1 and B2. The slit SLT includes an insulating material. The insulating material may include an organic insulating material, an inorganic insulating material, or a combination thereof. Each of the blocks B1 and B2 may include a conductive layer 110, a gate stack structure 120, multiple channel pillars 130, multiple source and drain pillars 140a and 140b, and multiple charge storage structures 150 disposed on a substrate 100.

The substrate 100 may include a cell region CR and a staircase region SR, as shown in FIG. 1. In some embodiments, the staircase region SR may be located on two opposite sides of the cell region CR. The substrate 100 may include a semiconductor substrate, and components formed on the semiconductor substrate such an active device (e.g., a PMOS, an NMOS, a CMOS, a JFET, a BJT, or a diode), an inner dielectric layer, a contact, a conductive line 160, an interlayer dielectric layer, and a via (e.g., an interconnect structure). However, for the convenience of illustration, only the conductive line 160 is shown in the drawings.

The conductive layer 110 is disposed between the substrate 100 and the gate stack structure 120, as shown in FIG. 2. The material of the conductive layer 110 may include doped polysilicon. For example, the material of the conductive layer 110 may include P-type doped polysilicon.

The gate stack structure 120 is disposed on the conductive layer 110, as shown in FIG. 2. The gate stack structure 120 includes multiple insulating layers 105a and multiple gate layers GL stacked alternately on each other. The gate layer GL is disposed between two adjacent insulating layers 105a so that the gate layers GL are electrically insulated from each other by the insulating layers 105a. The material of the gate layer GL may include tungsten (W), cobalt (Co), aluminum (Al), tungsten silicide ($WSi_x$), or cobalt silicide ($CoSi_x$). The material of the insulating layer 105a may include silicon oxide. The gate stack structure 120 includes a staircase structure 120S which is located in the staircase region SR. The staircase structure 120S has multiple stairs, and the height of the stairs gradually increases toward the cell region CR.

In some embodiments, the three-dimensional memory device 10 may further include multiple dummy gate stack structures DGS, as shown in FIG. 1. The dummy gate stack structures DGS may be disposed on the substrate 100 and respectively provided between the tiles T1 and T3, between the tiles T2 and T4, and around the T1 to T4. The dummy gate stack structures DGS has portions of sacrificial layers 105b which are retained and are not replaced by the gate layers GL.

Figure 3A:
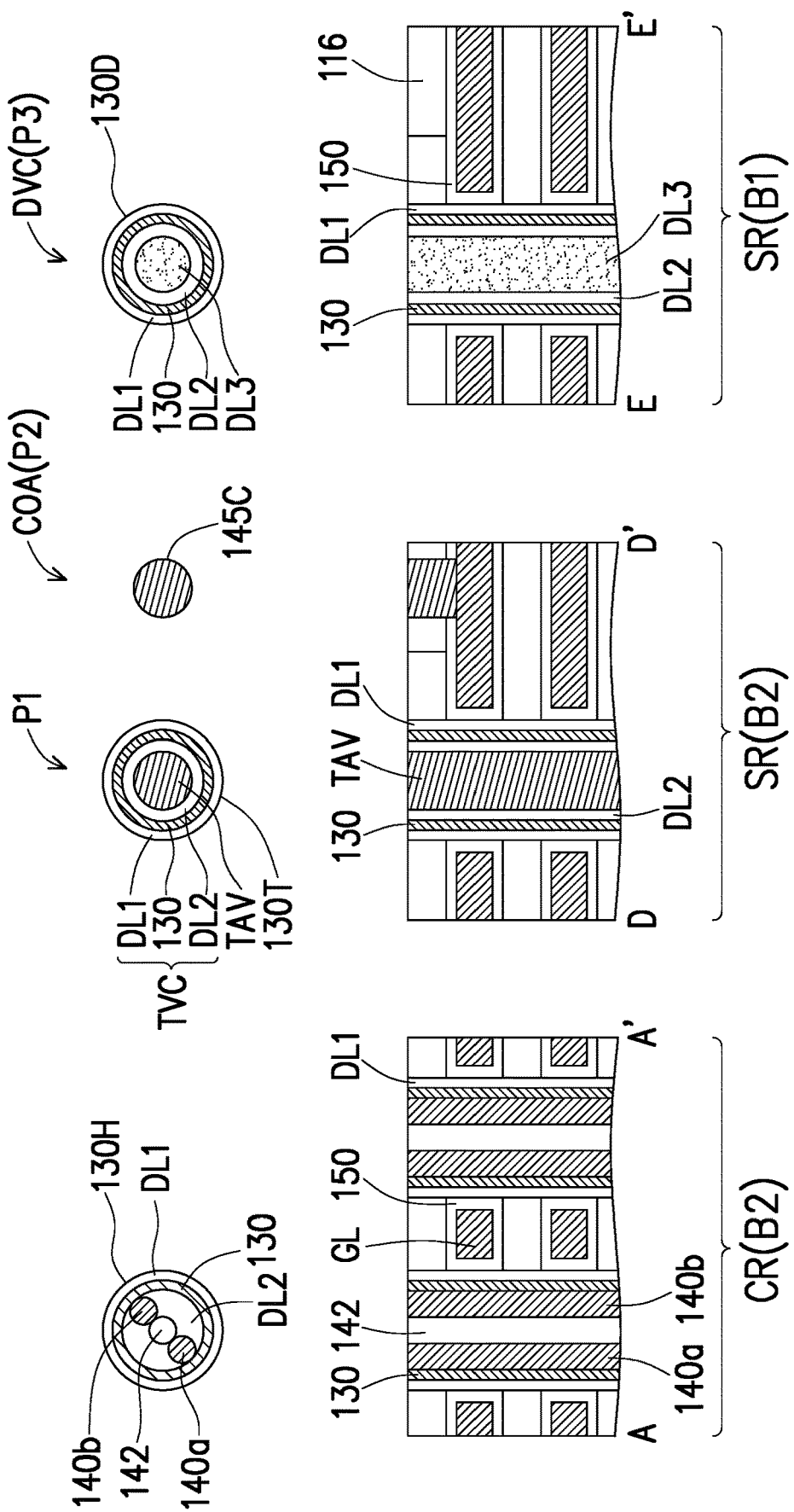
FIG. 3A to FIG. 3D are respectively schematic partial cross-sectional views taken along lines A-A', D-D', and E-E' of FIG. 1.
Figure 3B:
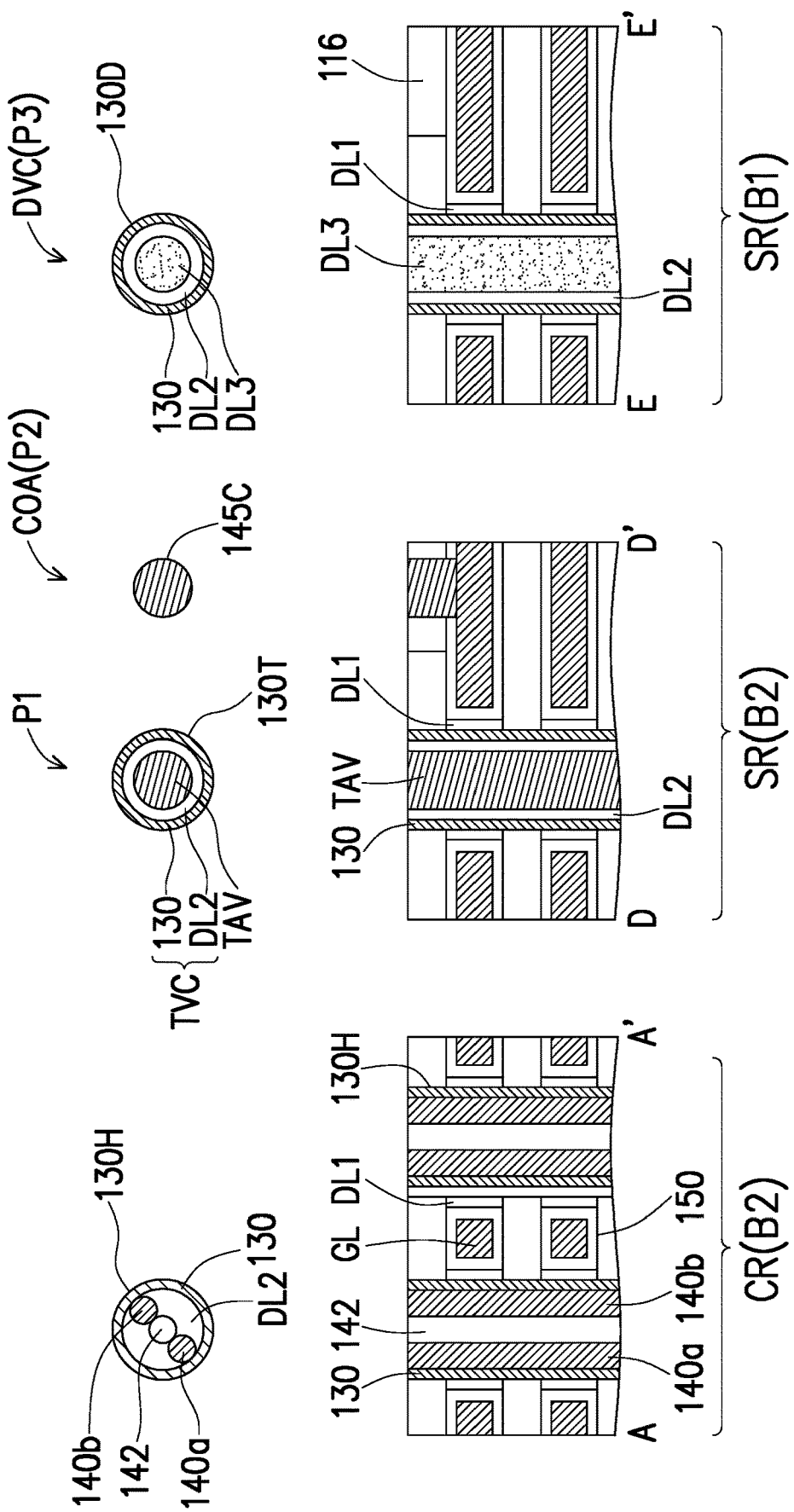
Figure 3C:
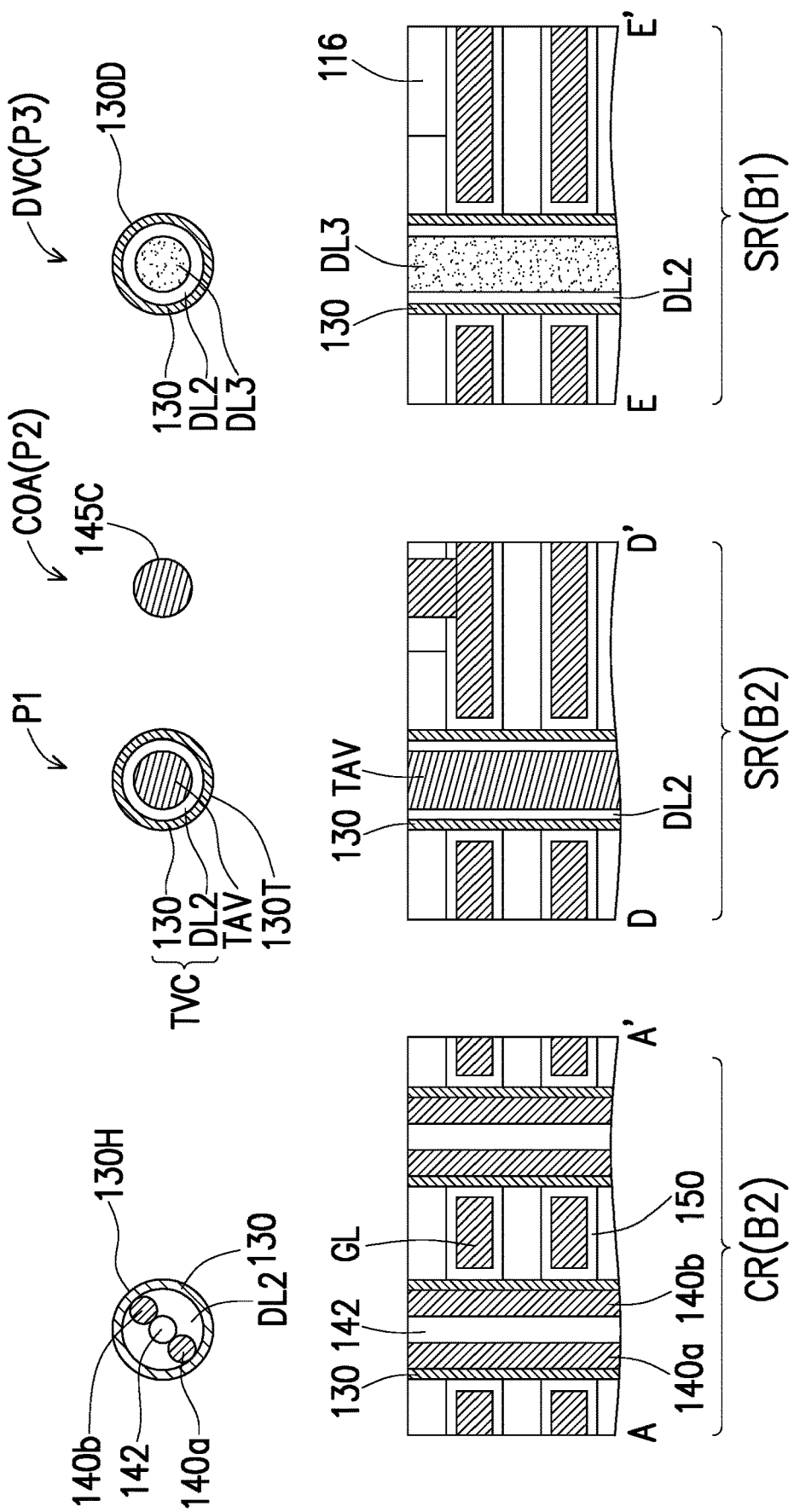
Figure 3D:
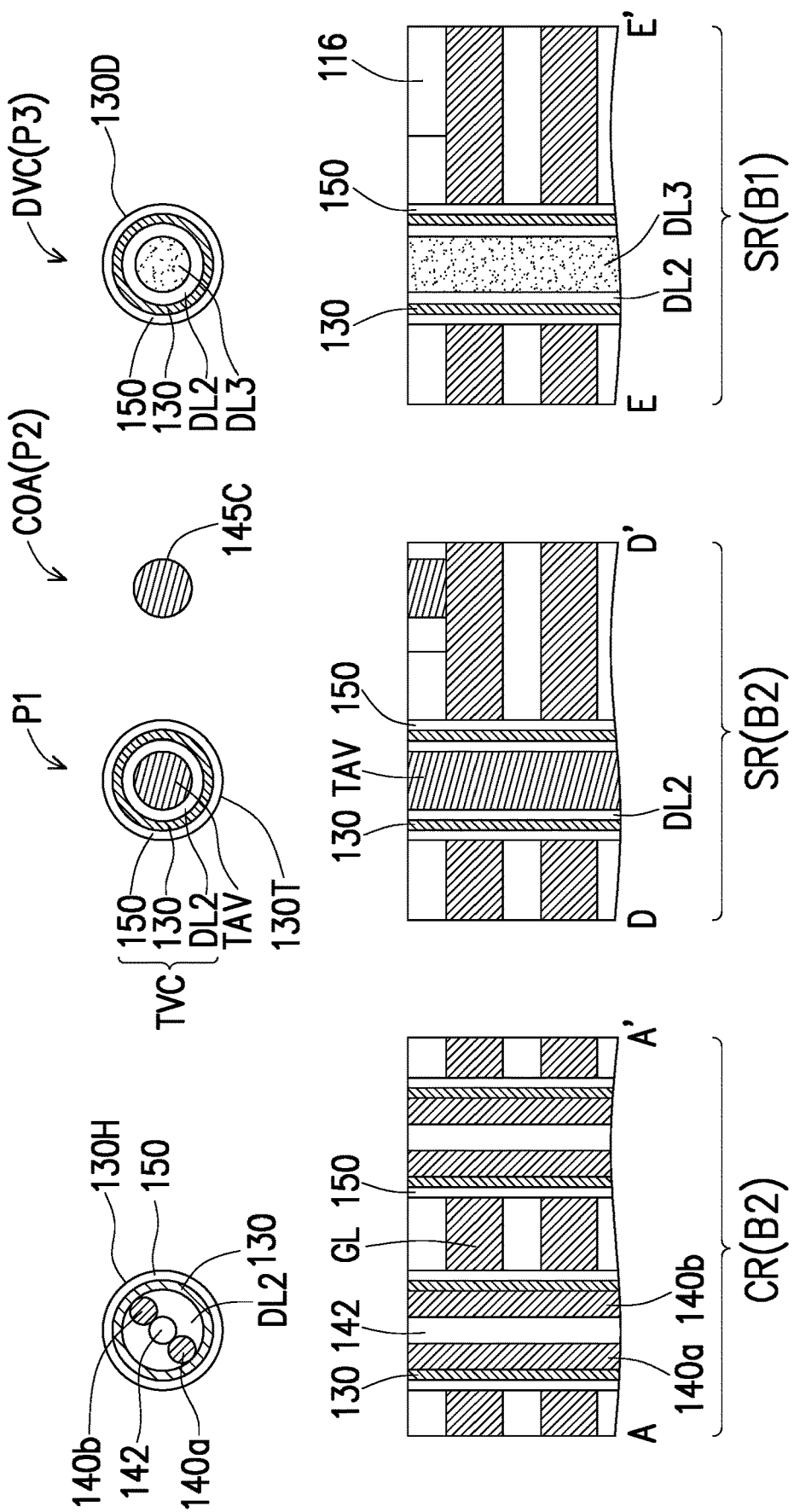

The charge storage structure 150 is disposed between each of the gate layers GL and the corresponding channel pillar 130, as shown in FIG. 2. In some embodiments, the charge storage structure 150 may be a nitride-oxide (NO) composite layer or an oxide-nitride-oxide (ONO) composite layer. In some embodiments, the charge storage structure 150 is formed after the channel pillar 130 is formed and thus surrounds the gate layer GL, as shown in FIG. 3A to FIG. 3C. In other embodiments, the charge storage structure 150 is formed before the channel pillar 130 is formed and thus surrounds the channel pillar 130, as shown in FIG. 3D.

A buffer layer and a barrier layer may be disposed between the gate layer GL and the charge storage structure 150. The material of the buffer layer is, for example, a high dielectric constant material having a dielectric constant greater than 7, such as aluminum oxide ($Al_2O_3$), hafnium oxide ($HfO_2$), lanthanum oxide ($La_2O_5$), a transition metal oxide, a lanthanide oxide, or a combination thereof. The material of the barrier layer is, for example, titanium (Ti), titanium nitride (TiN), tantalum (Ta), tantalum nitride (TaN), or a combination thereof.

The channel pillar 130 may be disposed on the substrate 100 and located in an opening 130H of the gate stack structure 120 in the cell region CR, as shown in FIG. 2. The channel pillar 130 may be provided in the cell region CR of the gate stack structure 120. Multiple channel pillars 130 may be provided in the cell region CR of each of the gate stack structures 120. In some embodiments, the channel pillar 130 may penetrate through the gate stack structure 120 and the conductive layer 110 and extend into the substrate 100. In the top view, the channel pillar 130 has, for example, a ring shape and may be continuous in its extending direction (e.g., in a direction perpendicular to the substrate 100), as shown in FIG. 2 and FIG. 3A to FIG. 3D. In other words, the channel pillar 130 is integral in its extending direction and is not divided into multiple disconnected portions. In some embodiments, the channel pillar 130 may have a circular profile (as shown in FIG. 3A to FIG. 3D) in the top view, but the disclosure is not limited thereto. In other embodiments, the channel pillar 130 may also have a profile in another shape (e.g., polygonal) in the top view. The channel pillar 130 may have a single radial dimension or a gradient radial dimension. In some embodiments, the radial dimension of the channel pillar 130 in the substrate 100 may be smaller than the radial dimension of the channel pillar 130 in the gate stack structure 120. In some embodiments, the radial dimension of the channel pillar 130 in the conductive layer 110 may gradually decrease from a portion of the conductive layer 110 close to the substrate 100 toward the substrate 100. The material of the channel pillar 130 may be a semiconductor material such as undoped polysilicon.

The source and drain pillars (also referred to as conductive pillars) 140a and 140b may be disposed on the substrate 100 and located in the opening 130H of the gate stack structure 120 in the cell region CR. In each of the channel pillars 130, a pair of source and drain pillars 140a and 140b connected to the channel pillar 130 is provided. Depending on different operation methods, a 1-bit operation or a 2-bit operation may be performed on the three-dimensional memory device 10. For example, when a voltage is applied to the source and drain pillars 140a and 140b, since the source and drain pillars 140a and 140b are connected to the channel pillar 130, electrons may be transferred along the channel pillar 130 and stored in the entire charge storage structure 150. Accordingly, a 1-bit operation may be performed on the three-dimensional memory device 10. In addition, for an operation involving Fowler-Nordheim tunneling, electrons or holes may be trapped in the charge storage structure 150 between the source pillar 140a and the drain pillar 140b. For an operation involving source side injection, channel-hot-electron injection, or band-to-band tunneling hot carrier injection, electrons or holes may be locally trapped in the charge storage structure 150 adjacent to one of the source and drain pillars 140a and 140b. Accordingly, a single level cell (SLC, 1 bit) or multi-level cell (MLC, greater than or equal to 2 bits) operation may be performed on the three-dimensional memory device 10. The source and drain pillars 140a and 140b may be connected to a source line/bit line via other conductive layers. The material of the source and drain pillars 140a and 140b may include doped polysilicon. In some embodiments, the source and drain pillars 140a and 140b may extend into the conductive layer 110 to form a bottom parasitic transistor PT in the conductive layer 110 with the channel pillar 130 extending into the conductive layer 110, so that the source and drain pillars 140a and 140b are not prone to leak current at the bottom.

Referring to FIG. 2 and FIG. 3A, in an embodiment, the opening 130H further includes therein a dielectric layer DL1 disposed between the channel pillar 130 and the gate stack structure 120. The dielectric layer DL1 may be continuous in its extending direction (e.g., in a direction perpendicular to the substrate 100). In other words, the dielectric layer DL1 is integral in its extending direction and is not divided into multiple disconnected portions. The dielectric layer DL1 may penetrate through the conductive layer 110 and be located in the substrate 100. The material of the dielectric layer DL1 may include silicon oxide. The dielectric layer DL1 may serve as an oxide layer or a bandgap engineered tunneling oxide layer adjacent to the channel in an ONO composite layer. In other words, the dielectric layer DL1 may be a tunneling dielectric layer composed of a single-layer oxide layer or a tunneling dielectric layer composed of an ONO composite layer (e.g., a tunneling composite layer portion of a BE-SONOS). A charge storage layer (i.e., a nitride layer in the ONO composite layer) and a barrier layer (i.e., an oxide layer adjacent to the gate layer GL in the ONO composite layer) in the charge storage structure 150 may be located between the channel pillar 130 and the gate layer GL and between the gate layer GL and the insulating layer 105a.

Referring to FIG. 3B, in another embodiment, the dielectric layer DL1 is disposed between the channel pillar 130 and the charge storage structure 150. However, the dielectric layer DL1 is not disposed in the opening 130H, but is disposed outside the opening 130H. Also, the dielectric layer DL1 is discontinuous in its extending direction (e.g., in a direction perpendicular to the substrate 100) and divided into multiple disconnected portions.

Referring to FIG. 3C and FIG. 3D, in another embodiment, the dielectric layer DL1 is not provided between the channel pillar 130 and the charge storage structure 150. The charge storage structure 150 is in contact with the gate layer GL and the insulating layer 105a.

The three-dimensional memory device 10 further includes a staircase structure 120S disposed in the staircase region SR and multiple plugs in an insulating layer 116 on the staircase structure 120S. The plugs may extend through the staircase structure 120S and even the conductive layer 110. The plugs provide support in the replacement process, which will be described in detail later. The plugs may include a conductive material, an insulating material, or a combination thereof. For example, the plugs include multiple dummy pillars DVC (or referred to as plugs P3), multiple contacts COA (or referred to as plugs P2), multiple dummy pillars TVC, and multiple through-array vias TAV in the multiple dummy pillars TVC (or the combinations of the multiple dummy pillars TVC and through-array vias TAV referred to as plugs P1), as shown in FIG. 1 and FIG. 2.

The dummy pillars DVC and TVC may extend through the staircase structure 120S and the conductive layer 110 and extend into the substrate 100, as shown in FIG. 2. The dummy pillars DVC and TVC are formed in openings 130D and 130T of the staircase structure 120S, respectively. The shape, radial size, or both of the openings 130T and 130D may be the same, similar or different. The shape of the openings 130D and 130T located in the staircase region SR in the top view may be the same as or similar to the shape of the opening 130H located in the cell region CR in the top view, as shown in FIG. 3A to FIG. 3D. The radial dimensions of the openings 130D and 130T are greater than or equal to the radial dimension of the opening 130H. The structures of the dummy pillar DVC in the opening 130D and the dummy pillar TVC in the opening 130T are similar to the structure in the opening 130H, but the source and drain pillars 140a and 140b are not provided in the dummy pillars DVC and TVC. In some embodiments, the dummy pillar DVC may include the dielectric layer DL1, the channel pillar 130, and dielectric layers DL2 and DL3, and the dummy pillar TVC may include the dielectric layer DL1, the channel pillar 130, and dielectric layer DL2, as shown in FIG. 3A. In other embodiments, the dummy pillar DVC may include the channel pillar 130 and the dielectric layers DL2 and DL3, and the dummy pillar TVC may include the channel pillar 130 and the dielectric layer DL2, but the dummy pillars DVC and TVC do not include the dielectric layer DL1, as shown in FIG. 3B and FIG. 3C. In some embodiments, the dummy pillar DVC may include the channel pillar 130, the dielectric layers DL2 and DL3, and the charge storage structure 150, as shown in FIG. 3D. The material of the dielectric layers DL2 and DL3 may include silicon oxide. The material of the channel pillar 130 may include undoped polysilicon. In alternative embodiments, according to the patterning process for defining the through-array via TAV, the dummy pillar TVC may also include a part of the dielectric layer DL3, which is located between the dielectric layer DL2 and the through-array vias TAV.

The contacts COA may respectively land on the gate layer GL (as shown in FIG. 1, FIG. 2, and FIG. 3A to FIG. 3D) and the conductive layer 110 (as shown in FIG. 1), so that the gate layer GL may be electrically connected to a word line 114 via the contact COA. The conductive layer 110 may also be connected to a conductive line above via the contact COA to further connect to the through-array via TAV. The contact COA is formed in an opening 145C of the staircase structure 120S. The opening 145C extends from the insulating layer 116 on the staircase structure 120S to the gate layer GL of each stair or the conductive layer 110. The radial dimension of the opening 145C for forming the contact COA is smaller than the radial dimension of the opening 130D for forming the dummy pillar DVC, as shown in FIG. 3A to FIG. 3D. In some embodiments, the material of the contact COA may include tungsten (W), cobalt (Co), aluminum (Al), tungsten silicide ($WSi_x$), or cobalt silicide ($CoSi_x$). The material of the insulating layer 116 may include silicon oxide.

The through-array via TAV extends through the staircase structure 120S and the conductive layer 110, extends into the substrate 100, and is electrically connected to the conductive line 160 in the substrate 100. The through-array via TAV is formed in the dummy pillar TVC in the staircase structure 120S.

Figures 4A, 4B:
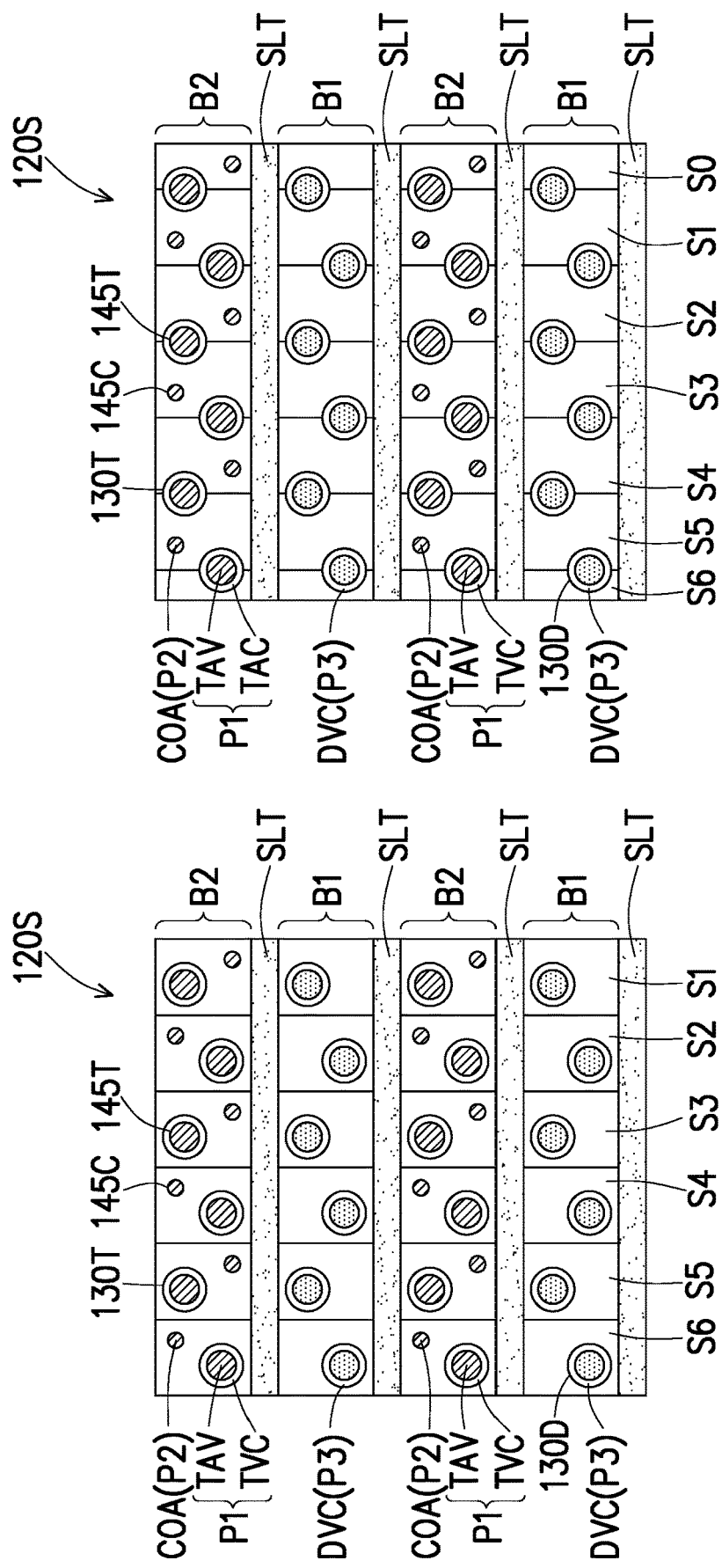
FIG. 4A to FIG. 4F are top views of a staircase structure according to various embodiments of the disclosure.
Figure 4D:
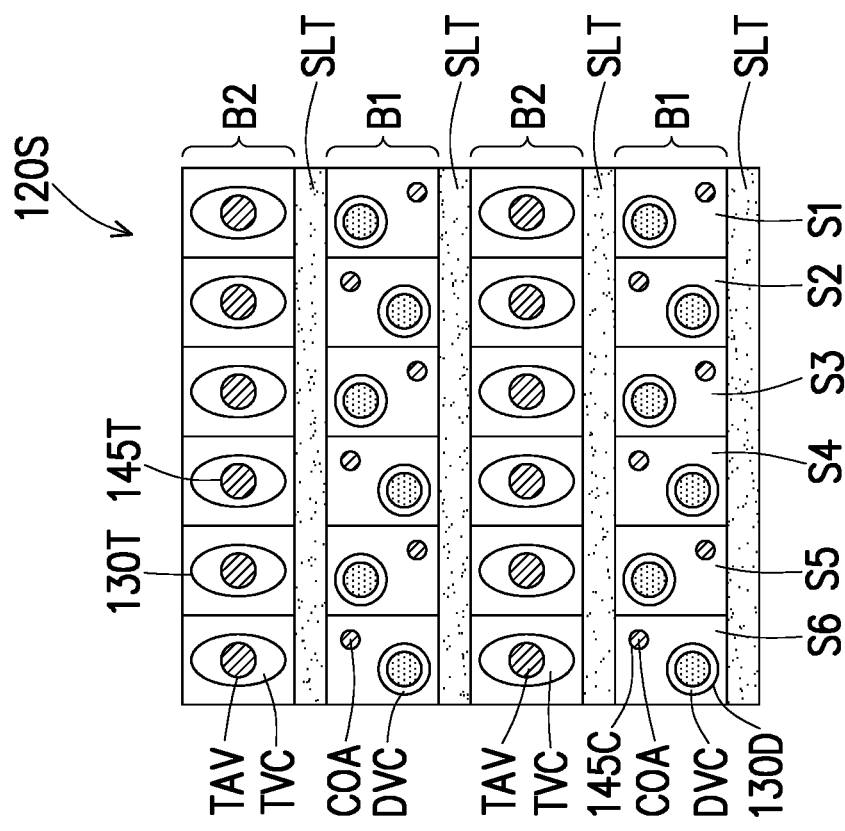
Figure 4C:
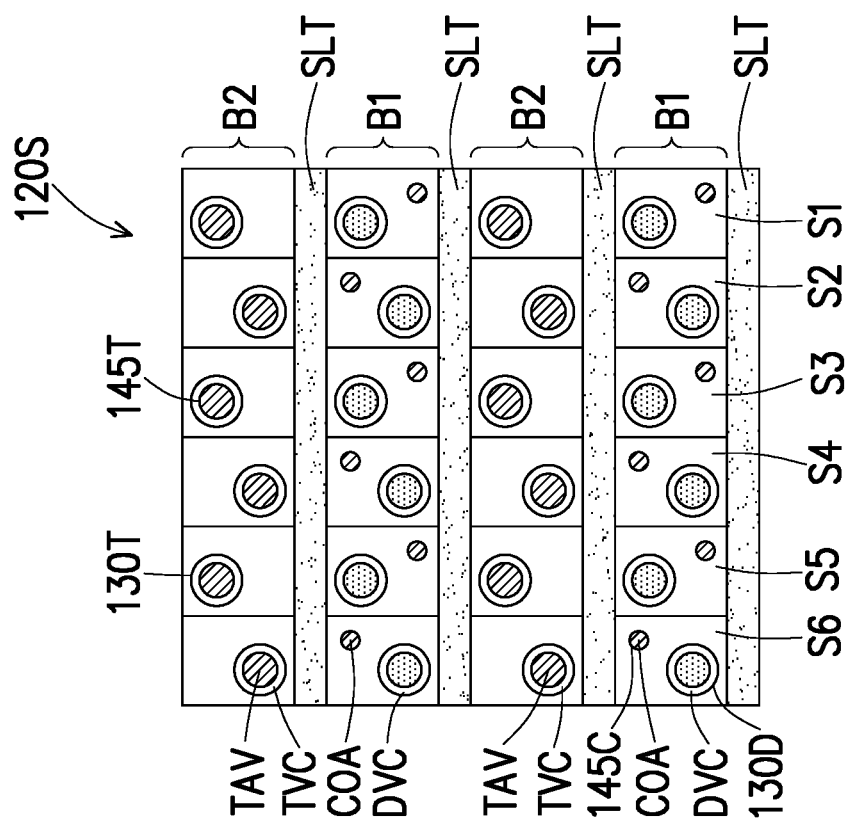
Figure 4F:
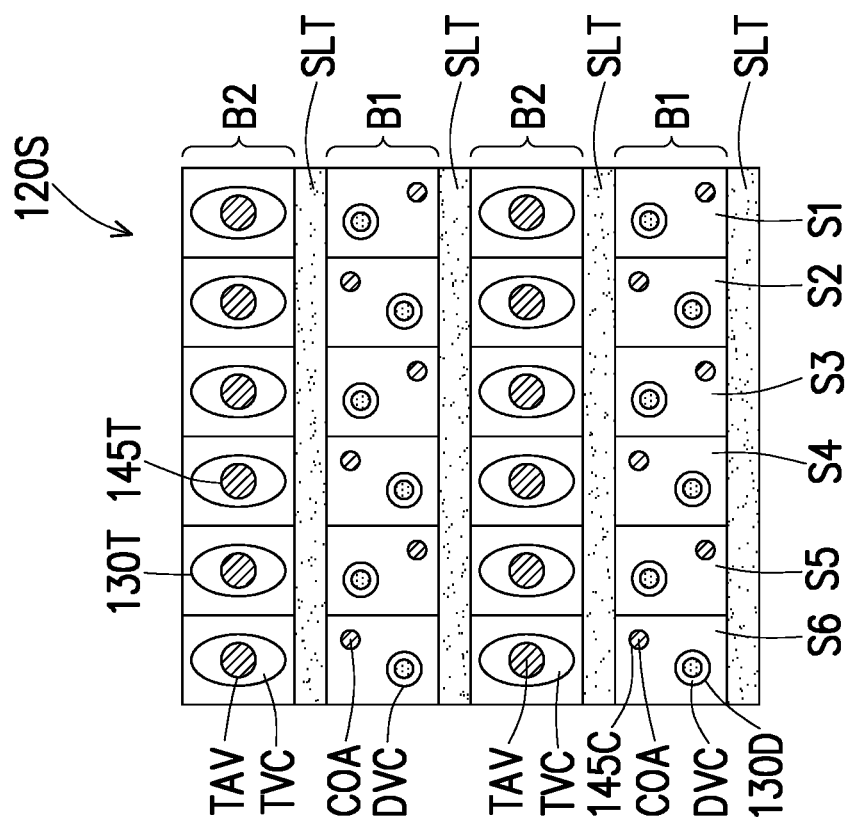
Figure 4E:
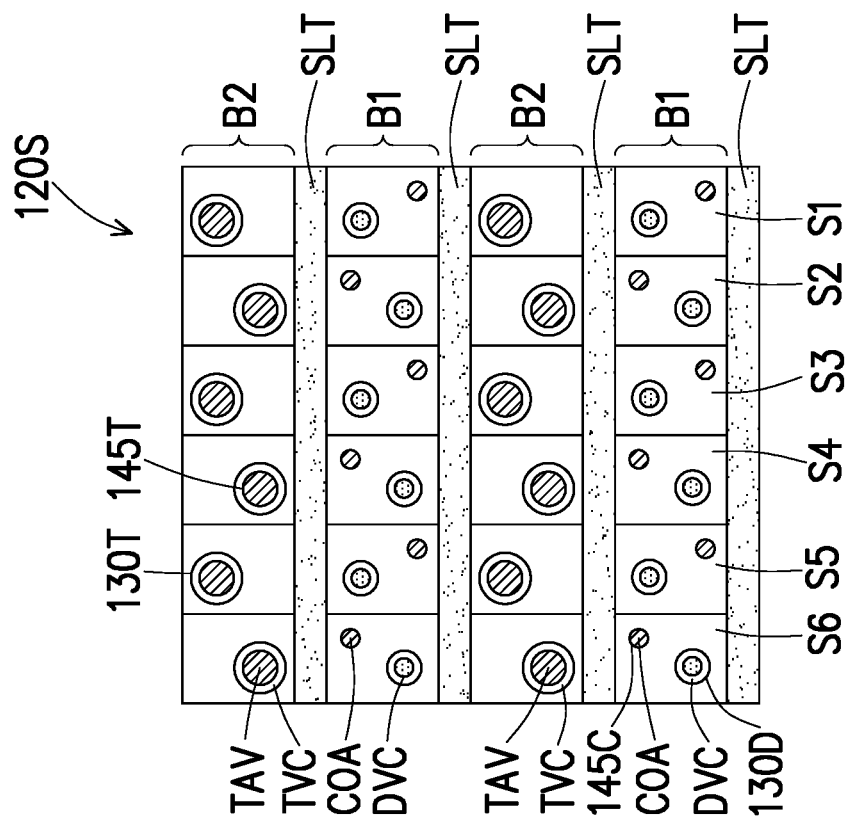

In some embodiments, the combinations of the multiple dummy pillars TVC and through-array vias TAV are referred to as plugs. The shape of the opening 130T for forming the dummy pillar TVC in the top view may be similar to the shape of the opening 130D for forming the dummy pillar DVC in the top view, as shown in FIG. 3A to FIG. 3D, FIG. 4A to FIG. 4C, and FIG. 4E. The shape of the opening 130T for forming the dummy pillar TVC in the top view may also be different from the shape of the opening 130D for forming the dummy pillar DVC in the top view, as shown in FIG. 4D and FIG. 4F. The radial dimension of the opening 130T may be equal to the radial dimension of the opening 130D, as shown in FIG. 4A to FIG. 4C. The radial dimension of the opening 130T may also be greater than the radial dimension of the opening 130D, as shown in FIG. 4D to FIG. 4F.

In some embodiments, the dummy pillar TVC may include the dielectric layer DL1, the channel pillar 130, and the dielectric layer DL2 between the channel pillar 130 and the through-array via TAV, as shown in FIG. 3A. In other embodiments, the dummy pillar TVC may include the channel pillar 130, and the dielectric layer DL2, but does not include the dielectric layer DL1, as shown in FIG. 3B and FIG. 3C. In other embodiments, the dummy pillar TVC may include the channel pillar 130, the dielectric layer DL2, and the charge storage structure 150, as shown in FIG. 3D. The material of the through-array via TAV may include tungsten (W), cobalt (Co), aluminum (Al), tungsten silicide ($WSi_x$), or cobalt silicide ($CoSi_x$).

The gate layer GL of the gate stack structure 120 is formed by a replacement process. The dummy pillars DVC and TVC can support the stack structure before the replacement process of the gate layer GL is performed. If they are not properly arranged, the stack structure may bend or even collapse. The embodiments of the disclosure propose various arrangements of the dummy pillars DVC and TVC, and arrangements of the contacts COA, and the through-array vias TAV adjusted correspondingly according to the arrangements of the dummy pillars DVC and TVC, so as to effectively prevent bending or even collapse of the stack structure, as shown in FIG. 4A to FIG. 4F. For clarity, FIG. 4A to FIG. 4F show stairs S1 to S6 or stairs S0 to S6 of part of the staircase structure 120S and part of the components of the memory device in area 400 shown in FIG. 1, while other components are omitted.

Referring to FIG. 4A and FIG. 4B, in some embodiments, multiple through-array vias TAV in dummy pillars TVC and multiple contacts COA are disposed in multiple blocks B2, and multiple dummy pillars DVC are individually disposed in multiple blocks B1. The through-array vias TAV in the dummy pillars TVC in the same block B2 are staggered with each other, for example, in a zigzag pattern. The contacts COA in the same block B2 are staggered with each other, for example, in a zigzag pattern. In addition, the through-array vias TAV in the dummy pillars TVC and the contacts COA in the same block B2 are staggered with each other, for example, in a chain pattern. The dummy pillars DVC in the same block B1 are staggered with each other, for example, in a zigzag pattern. The through-array vias TAV in the dummy pillars TVC and the dummy pillars DVC in the same stair of the staircase structure 120S are arranged in a column. The contacts COA in the same stair of the staircase structure 120S are arranged in another column.

In some embodiments, each of the through-array vias TAV in the dummy pillars TVC and each of the dummy pillars DVC respectively extend through one stair of the staircase structure 120S, as shown in FIG. 4A. In other embodiments, each of the through-array vias TAV in the dummy pillars TVC and each of the dummy pillars DVC respectively extend through two adjacent stairs (e.g., the stairs S1 and S2) of staircase structure 120S, as shown in FIG. 4B.

Referring to FIG. 4C to FIG. 4F, in other embodiments, multiple dummy pillars DVC and multiple contacts COA are disposed in multiple blocks B1, and multiple through-array vias TAV in dummy pillars TVC are individually disposed in multiple blocks B2. The dummy pillars DVC in the same block B1 are staggered with each other, for example, in a zigzag pattern. The contacts COA in the same block B1 are staggered with each other, for example, in a zigzag pattern. The dummy pillars DVC and the contacts COA in the same block B1 are staggered with each other, for example, in a chain pattern.

In some embodiments, the through-array vias TAV in the dummy pillars TVC in the same block B2 are staggered with each other, for example, in a zigzag pattern, as shown in FIG. 4C and FIG. 4E. In other embodiments, the through-array vias TAV in the dummy pillars TVC in the same block B2 are arranged in a row with each other, and the through-array vias TAV in the dummy pillars TVC in multiple blocks B2 are arranged in an array, as shown in FIG. 4D and FIG. 4F. The dummy pillars DVC and the through-array vias TAV in the dummy pillars TVC in the same stair may be arranged in a column, and the contacts COA in the same stair may be arranged in another column as shown in FIG. 4C to FIG. 4F.

In some embodiments, the profile shape of the through-array vias TAV in the dummy pillars TVC in the top view and the profile shape of the dummy pillars DVC in the top view may be the same or similar, and for example, may be both circular, as shown in FIG. 4A to FIG. 4C and FIG. 4E. In other embodiments, the profile shape of the through-array vias TAV in the dummy pillars TVC in the top view and the profile shape of the dummy pillars DVC in the top view may also be different. For example, the profile shape of the through-array vias TAV in the dummy pillars TVC in the top view may be elliptical, and the profile shape of the dummy pillars DVC in the top view may be circular, as shown in FIG. 4D and FIG. 4F.

In some embodiments, the radial dimension of the dummy pillars TVC is equal to the radial dimension of the dummy pillars DVC, as shown in FIG. 4A to FIG. 4C. In other embodiments, the radial dimension of the dummy pillars TVC is greater than the radial dimension of the dummy pillars DVC, as shown in FIG. 4D to FIG. 4F.

In the above embodiments, the contacts COA may be disposed in the same block with the through-array vias TAV in the dummy pillars TVC or may be disposed in the same block with the dummy pillars DVC; the contacts COA and the through-array vias TAV in the dummy pillars TVC or the dummy pillars DVC may be arranged in a staggered pattern to provide uniform support for the entire staircase structure. The dummy pillars DVC or the through-array vias TAV in the dummy pillars TVC may be individually disposed in the same block; the dummy pillars DVC or the through-array vias TAV in the dummy pillars TVC may the arranged in a staggered pattern to provide uniform support for the entire staircase structure, or their radial dimension may be increased or their shape may be changed to improve the support effect for each stair.

FIG. 5A to FIG. 5K are top views showing a manufacturing process of a three-dimensional memory according to an embodiment of the disclosure. FIG. 6A to FIG. 6K are schematic cross-sectional views taken along lines I-I', II-II', and III-III' in FIG. 5A to FIG. 5K.

Figure 5A:
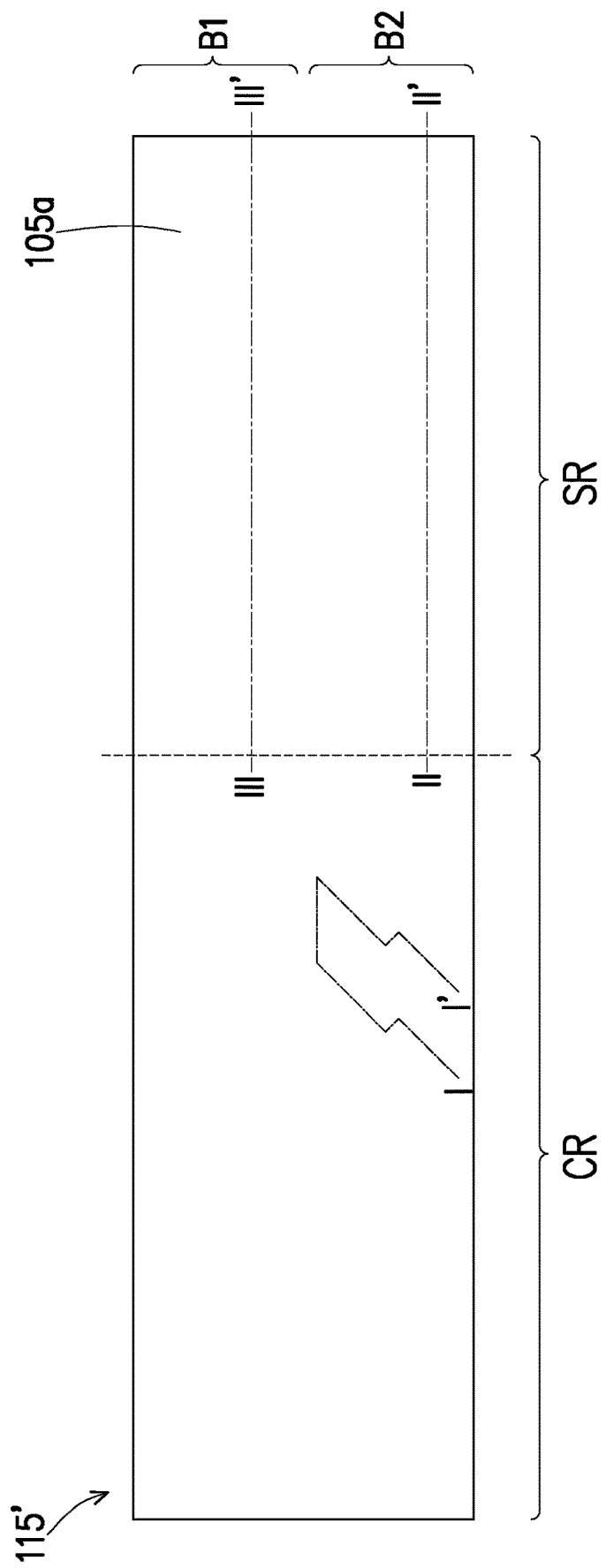
Figure 6A:
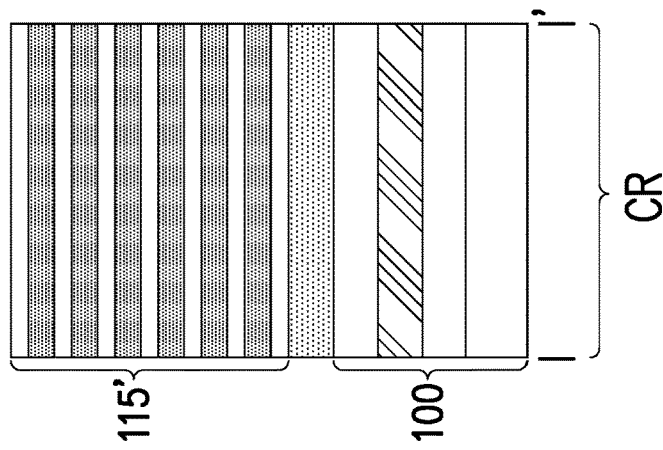
FIG. 6A to FIG. 6K are schematic partial cross-sectional views taken along lines I-I', II-II', and III-III' in FIG. 5A to FIG. 5K.
Figure 6A:
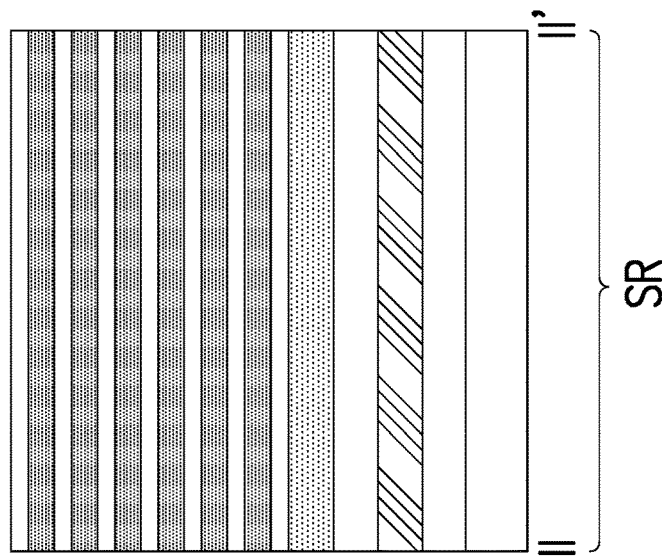
Figure 6A:
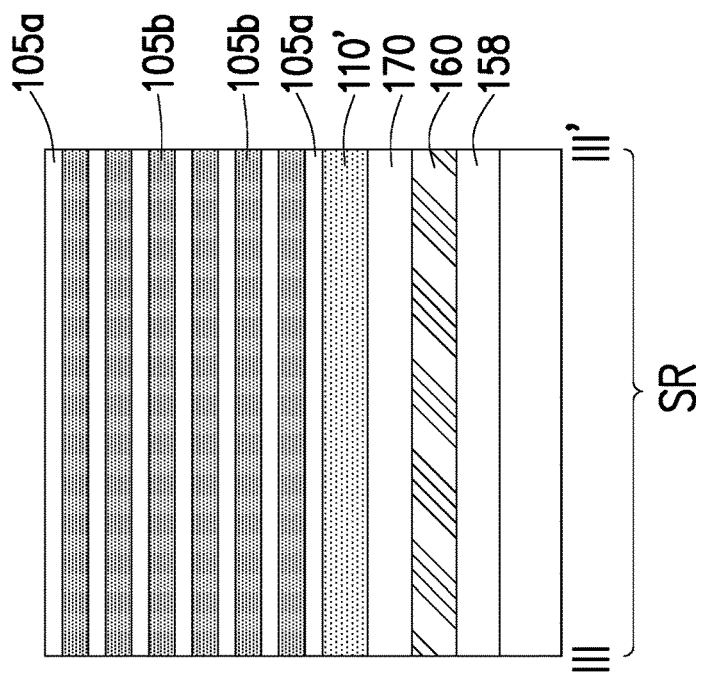

First, referring to FIG. 5A and FIG. 6A, a substrate 100 is provided. The substrate 100 may include a semiconductor substrate, and components formed on the semiconductor substrate such an active device, an inner dielectric layer 158, a contact, a conductive line 160, an interlayer dielectric layer 170, and a via (e.g., an interconnect structure). However, for convenience of illustration, only the inner dielectric layer 158, the conductive line 160, and the interlayer dielectric layer 170 are shown in the drawings.

Next, a conductive material layer 110' is formed on the substrate 100. The conductive material layer 110' may include doped polysilicon. Afterwards, a stack structure 115' is formed on the conductive material layer 110'. In some embodiments, the stack structure 115' may include multiple insulating material layers 105a and multiple sacrificial material layers 105b alternately stacked with each other on the conductive material layer 110'. In some embodiments, the insulating material layer 105a may be a silicon oxide layer, and the sacrificial material layer 105b may be a silicon nitride layer.

Figure 6B:
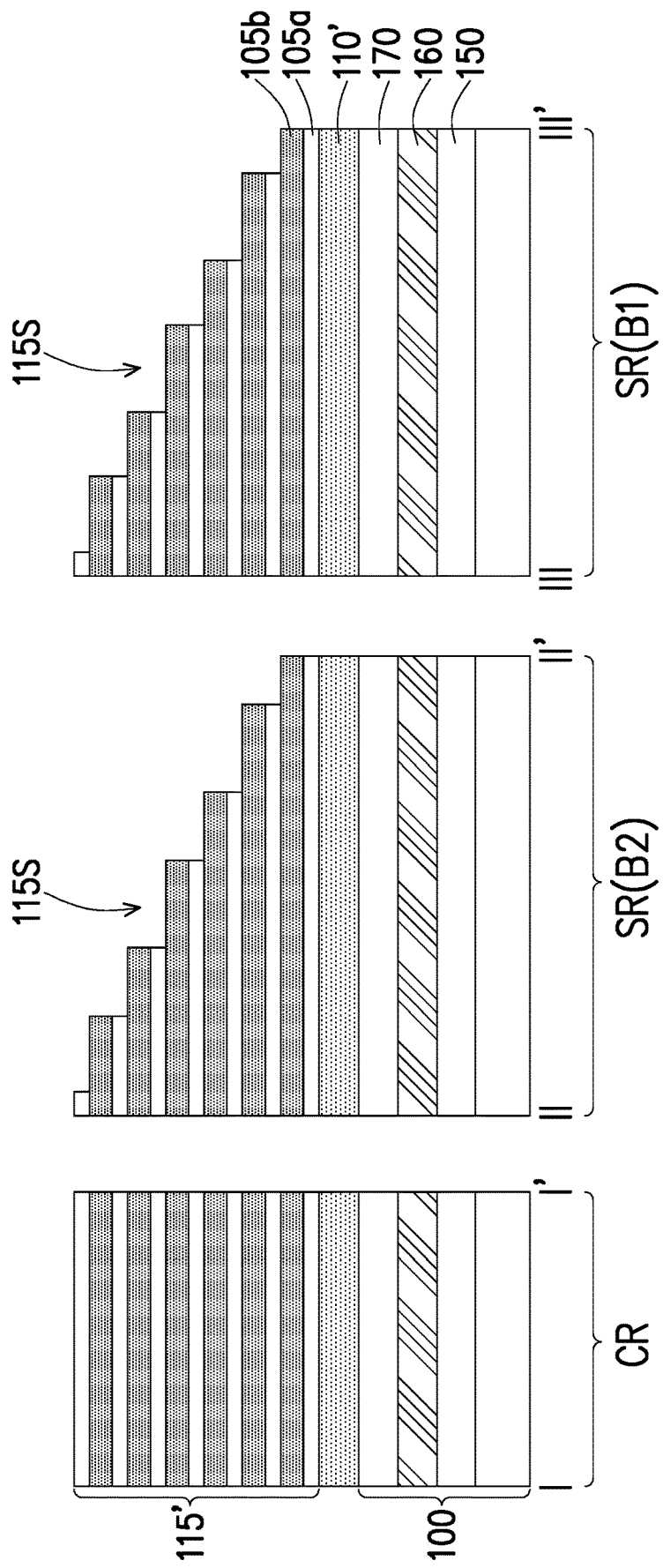

Referring to FIG. 5B and FIG. 6B, the stack structure 115' is patterned to form a staircase structure 115S in a staircase region SR.

Figure 5C:
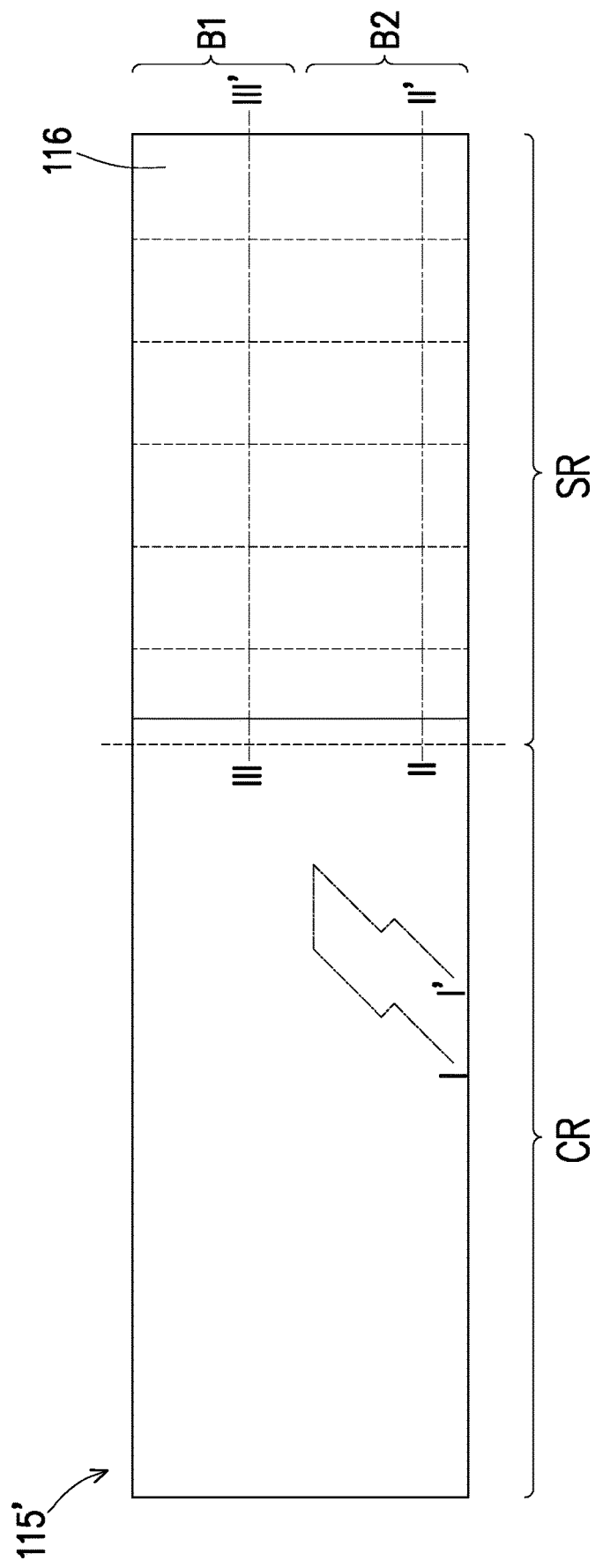
Figure 6C:
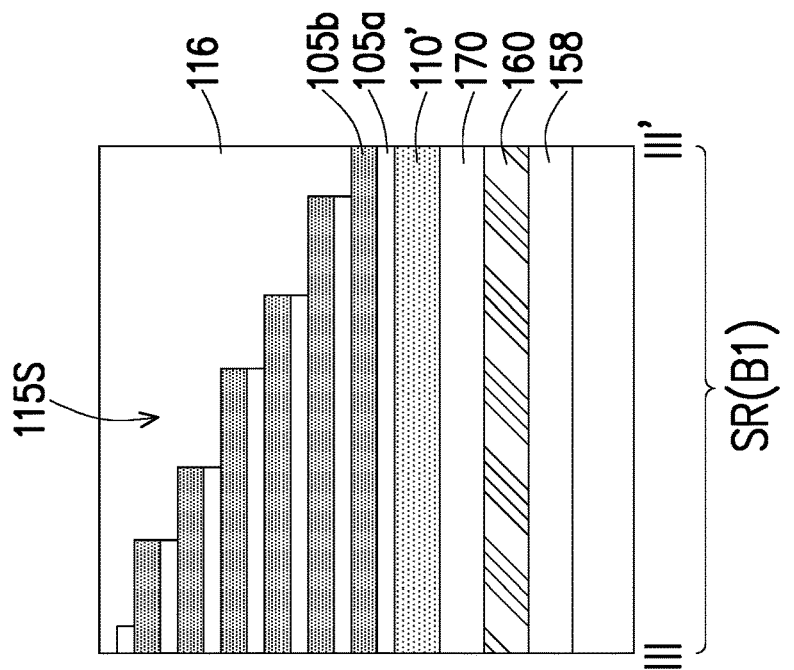
Figure 6C:
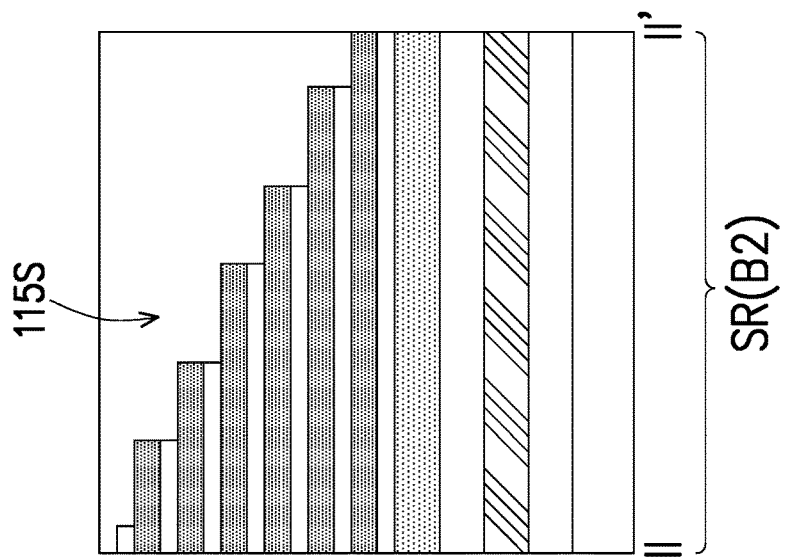
Figure 6C:
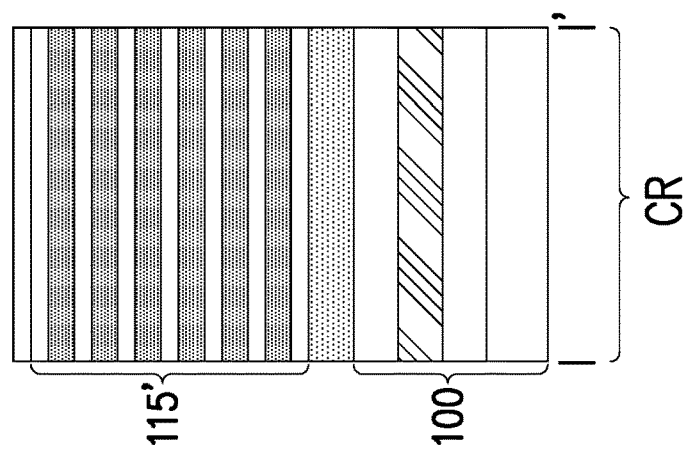

Referring to FIG. 5C and FIG. 6C, an insulating layer 116 is formed on the stack structure 115'. The method of forming the insulating layer 116 may be as follows. First, a silicon oxide layer is formed by high-density plasma chemical vapor deposition. Next, another silicon oxide layer is formed by plasma-enhanced chemical vapor deposition. Afterwards, planarization is performed by chemical-mechanical polishing so that the top surfaces of the insulating layer 116 in the cell region CR and the staircase region SR are coplanar.

Figure 5D:
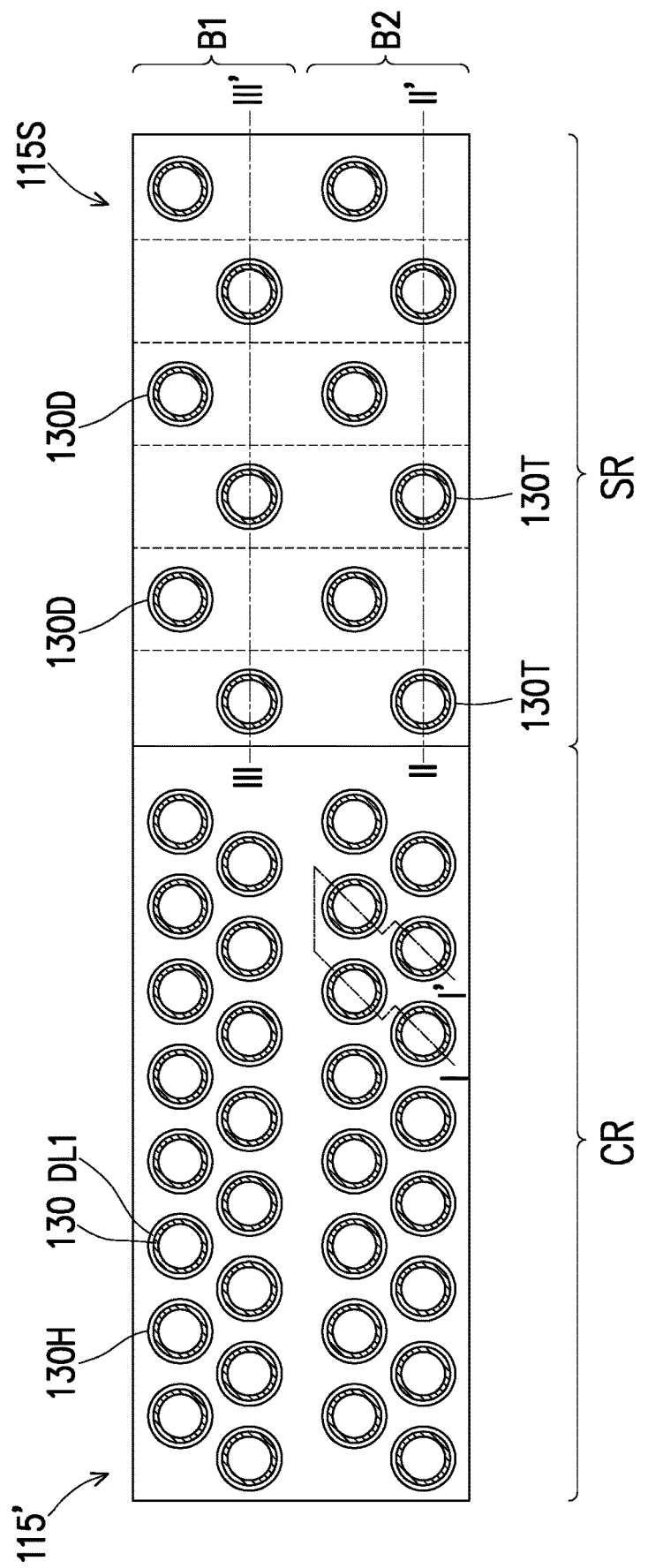
Figure 6D:
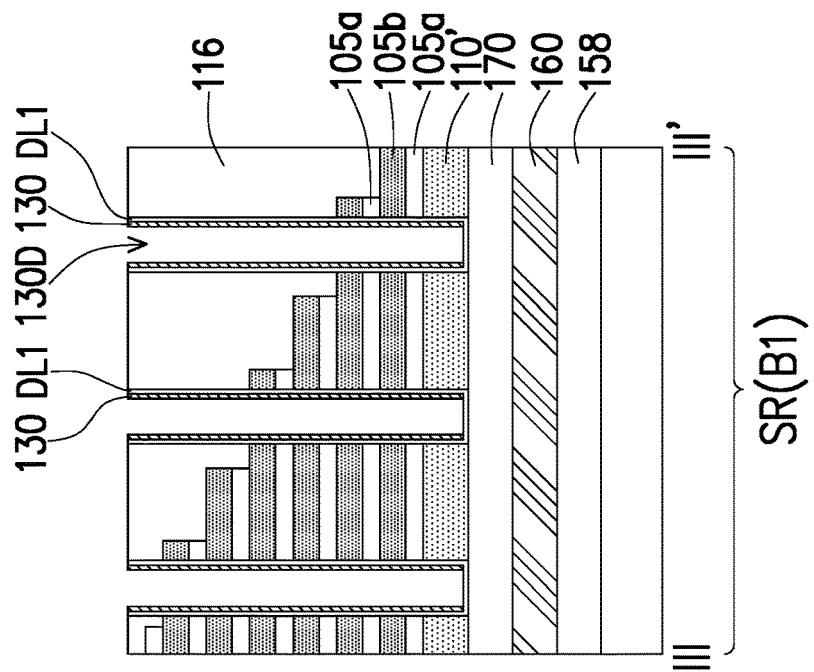
Figure 6D:
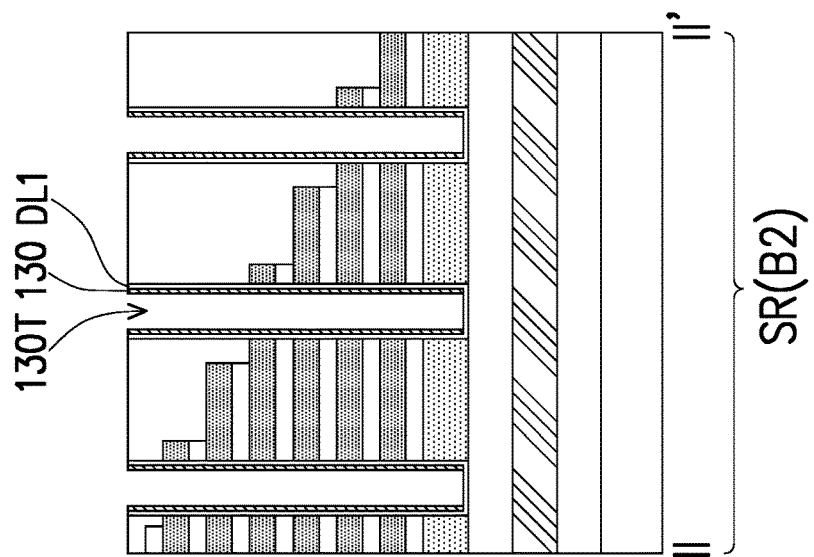
Figure 6D:
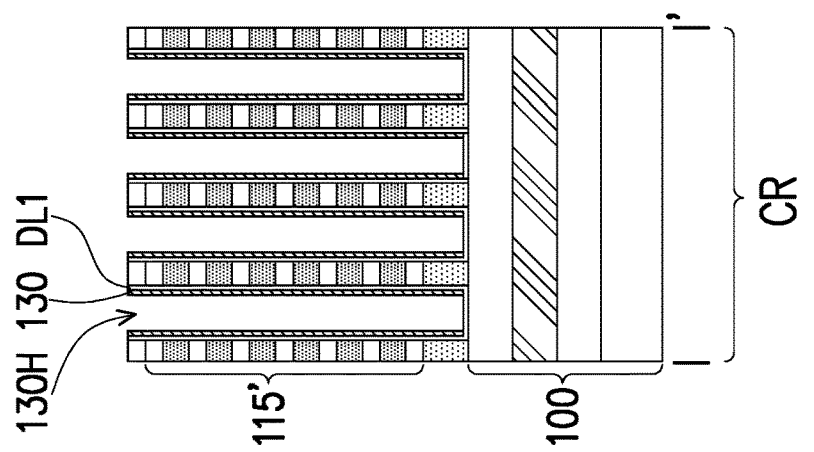

Next, referring to FIG. 5D and FIG. 6D, lithography and etching processes are performed to form openings 130H, 130T, and 130D in the stack structure 115'. Then, a dielectric layer DL1 and a channel material layer (not shown) are sequentially formed on the sidewalls and bottoms of the openings 130H, 130T, and 130D. Furthermore, the channel material layer located at the bottoms of the openings 130H, 130T, and 130D may be removed by an etch-back process to form channel pillars 130. In some embodiments, the radial dimensions of the openings 130T and 130D may be greater than the radial dimension of the opening 130H.

In some embodiments, in the process of forming the openings 130H, 130T, and 130D and removing the insulating material layer 115a and/or the sacrificial material layer 115b, the conductive material layer 110' may serve as an etch stop layer, so that the depth of the openings 130H, 130T, and 130D can be well controlled. For example, to form the openings 130H, 130T, and 130D, the insulating material layer 115a and the sacrificial material layer 115b on the conductive material layer 110' may be first removed by an etching process to form openings exposing the conductive material layer 110'. Then, the conductive material layer 110' exposed by the openings may be removed by another etching process to form the openings 130H, 130T, and 130D which expose the interlayer dielectric layer 170.

Figure 5E:
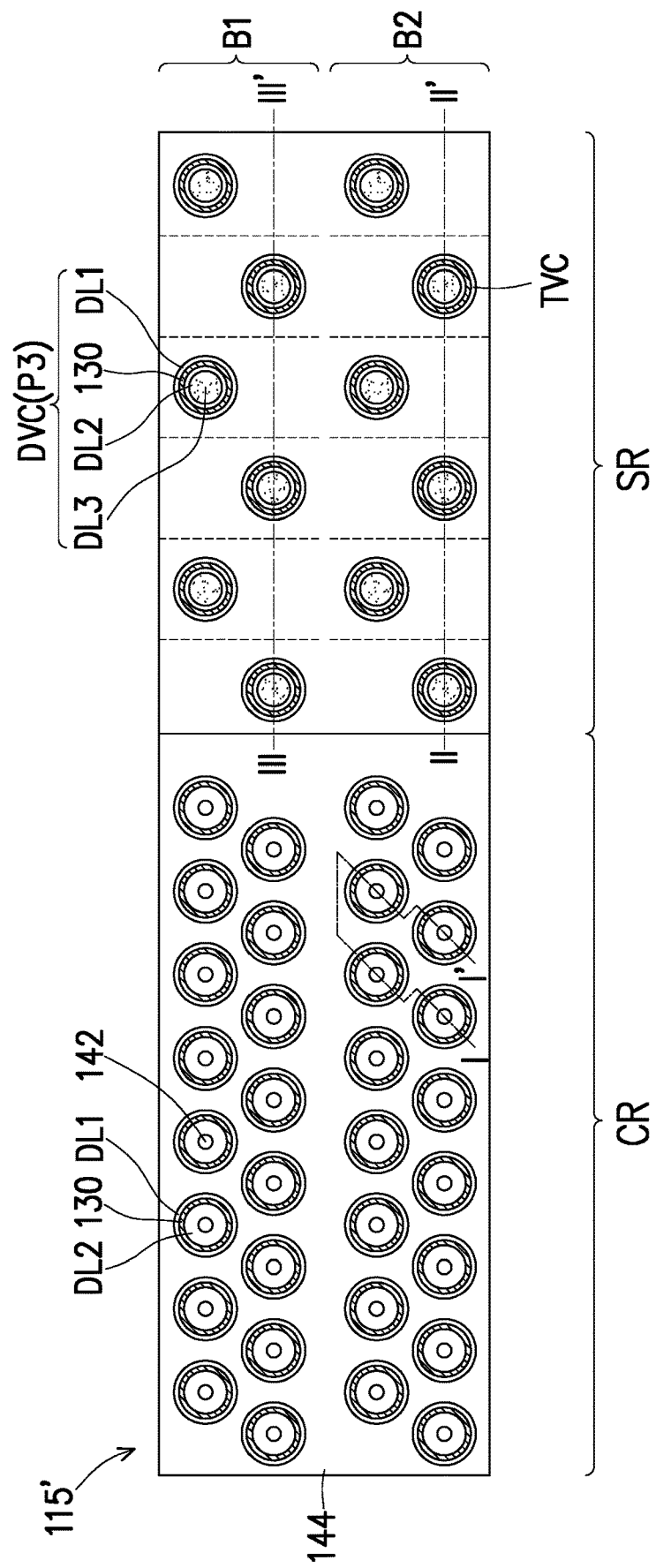
Figure 6E:
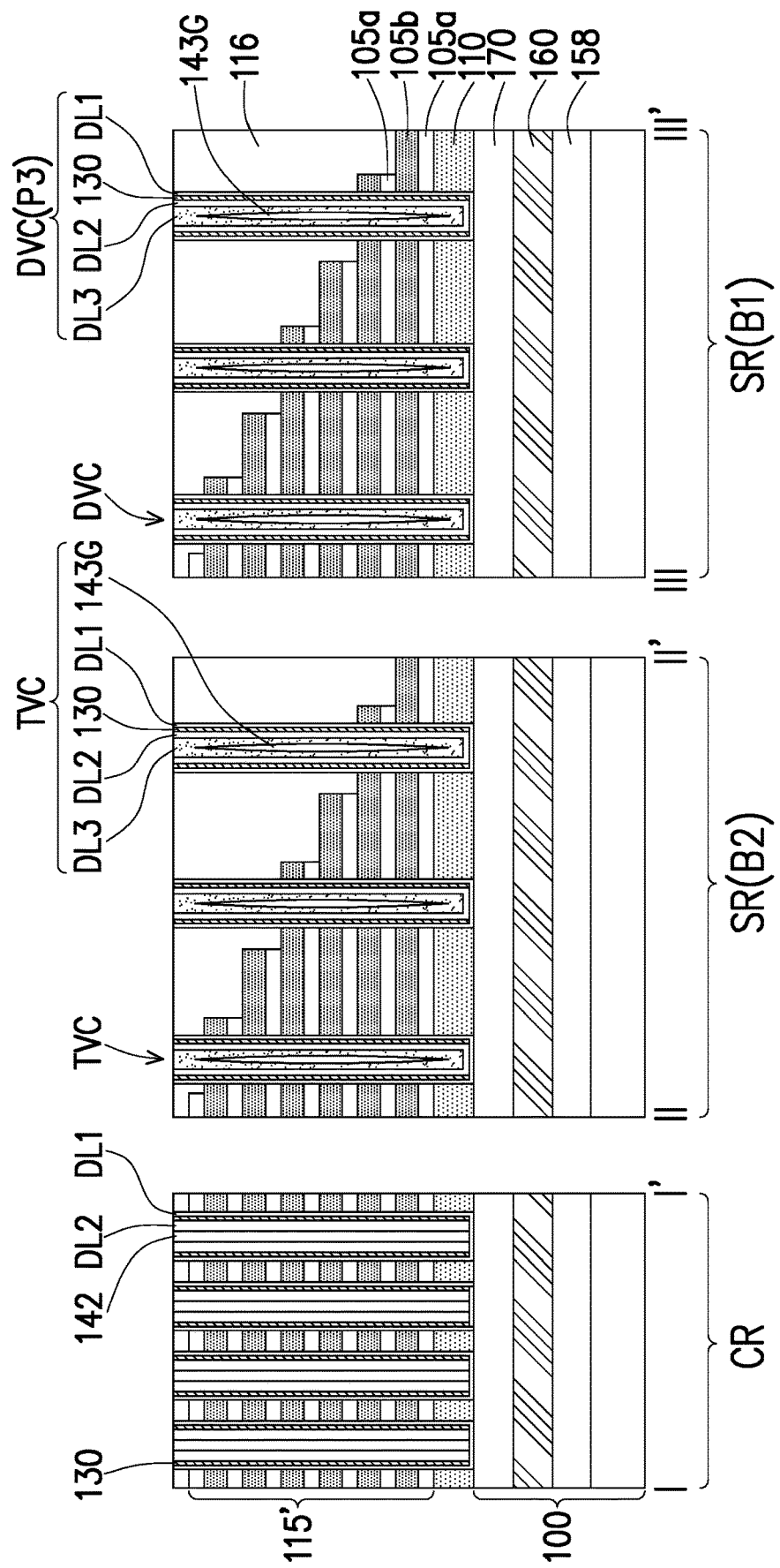

Then, referring to FIG. 5E and FIG. 6E, a dielectric layer DL2 is formed on the sidewall of the channel pillar 130 and on the dielectric layer DL1 exposed by the channel pillar 130. The dielectric layer DL2 does not fully fill the openings 130H, 130T, and 130D but leaves the central portions of the openings 130H, 130T, and 130D unfilled. Afterwards, an insulating material is filled in the central portions of the openings 130H, 130T, and 130D. The radial dimension of the opening 130H is small, so its central portion is fully filled with the insulating material. The radial dimensions of the openings 130T and 130D are large, so their central portions are not fully filled with the insulating material but have space left therein. Next, an etch-back process is performed. The insulating material in the openings 130T and 130D is etched away by the etchant flowing into the space, while the insulating material remaining in the opening 130H forms an insulating pillar 142. The insulating pillar 142 and the dielectric layer DL2 have different materials, the material of the insulating pillar 142 is, for example, silicon nitride. Then, a dielectric layer DL3 is formed in the space in the openings 130T and 130D. The material of the dielectric layer DL3 is silicon oxide, for example. In some embodiments, the dielectric layer DL3 may be formed by a chemical vapor deposition method having a weaker gap filling capability, so that the opening 130T is not fully filled with the dielectric layer DL3, and a gap 143G is left. As a result, the dummy pillars TVC and dummy pillars DVC (or referred to as plugs P3) are formed in the openings 130T and 130D, respectively.

Figure 5F:
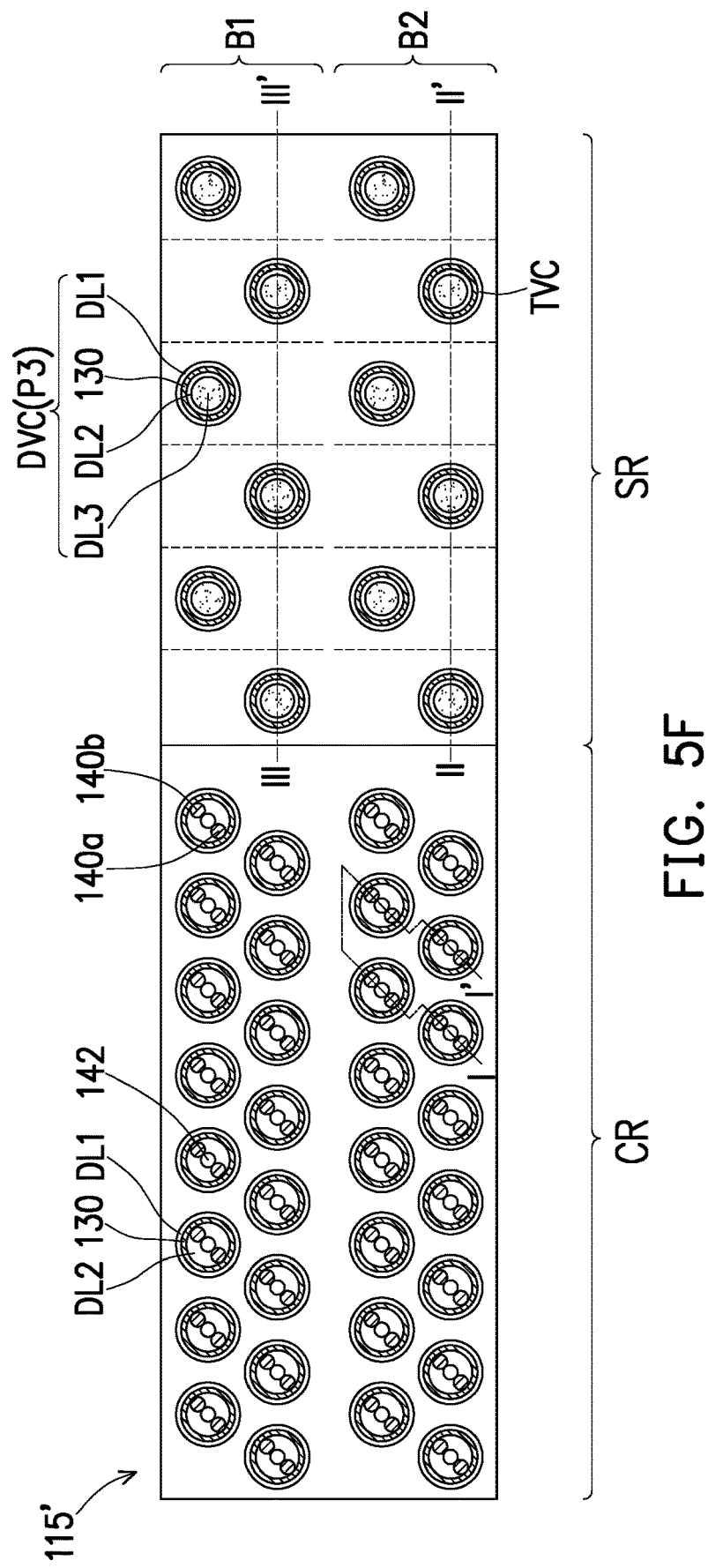
Figure 6F:
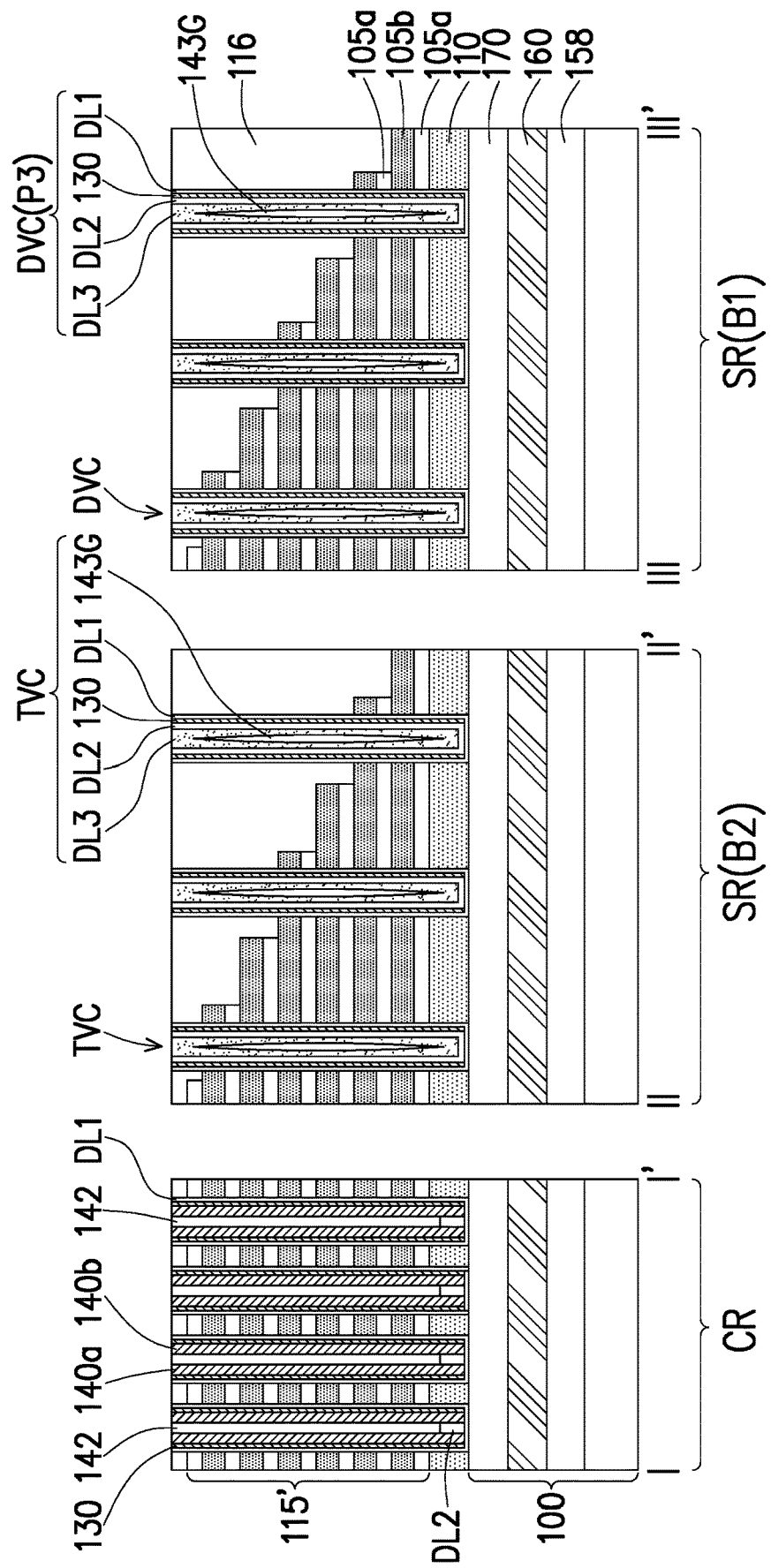

Referring to FIG. 5F and FIG. 6F, source and drain pillar openings are formed in the dielectric layer DL2 on two opposite sides of the insulating pillar 142 in the cell region CR, and a material such as doped polysilicon is filled in the source and drain pillar openings to form source and drain pillars 140a and 140b. Each channel pillar 130 may be provided with a pair of source and drain pillars 140a and 140b.

Figure 5G:
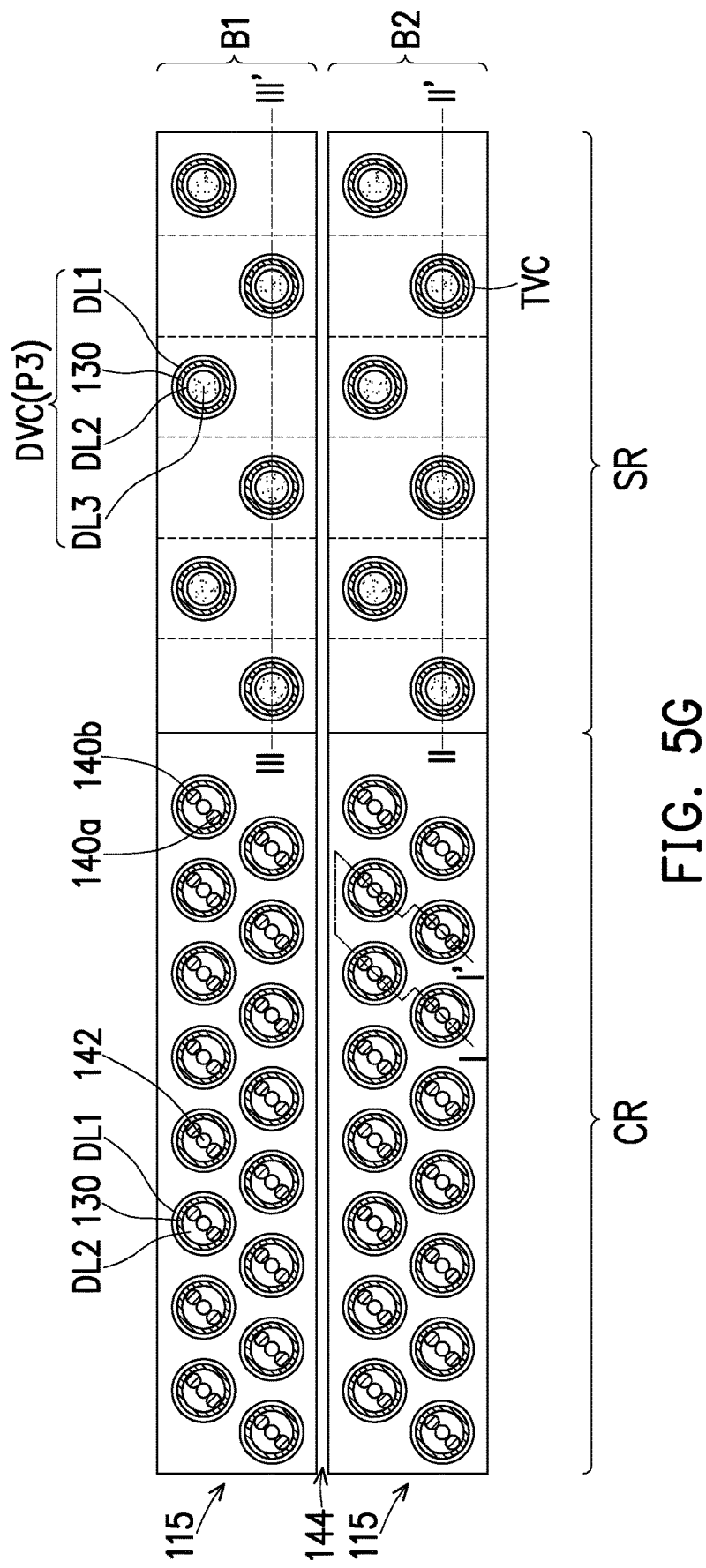
Figure 6G:
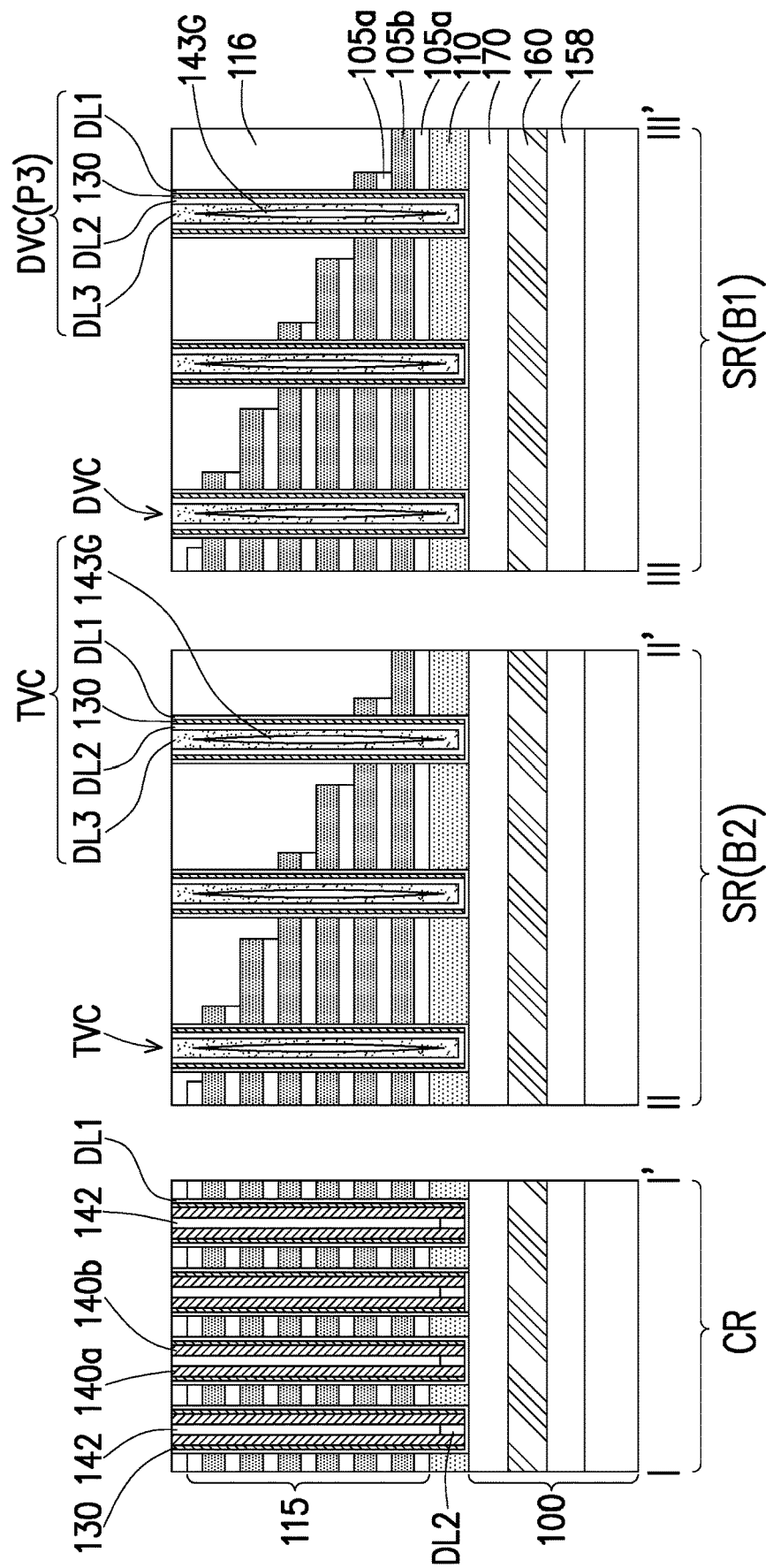

Then, referring to FIG. 5G and FIG. 6G, a patterning process is performed on the stack structure 115' and the conductive material layer 110' to form multiple trenches 144 penetrating through the stack structure 115' and the conductive material layer 110'. The trenches 144 may divide the stack structure 115' and the conductive material layer 110' into multiple patterned stack structures 115 and multiple conductive layers 110 to define multiple tiles (e.g., the tiles T1 to T4 as shown in FIG. 1) and multiple blocks (e.g., the blocks B1 and B2 as shown in FIG. 1) in each tile and to isolate at least one of the conductive layers 110 from other conductive layers 110. In some embodiments, in the above patterning process, a portion of the dielectric layer 170 is also slightly removed, so that the trench 144 extends into the dielectric layer 170. In some embodiments, the above patterning process may include the following steps. First, a first patterning process is performed on the stack structure 115' by using the conductive material layer 110' as an etch stop layer to form multiple patterned stack structures 115 on the conductive material layer 110'. Next, a second patterning process is performed on the conductive material layer 110' to form multiple conductive layers 110. The etching masks used in the first patterning process and the second patterning process may be the same or different, and the disclosure is not limited thereto.

Figure 5H:
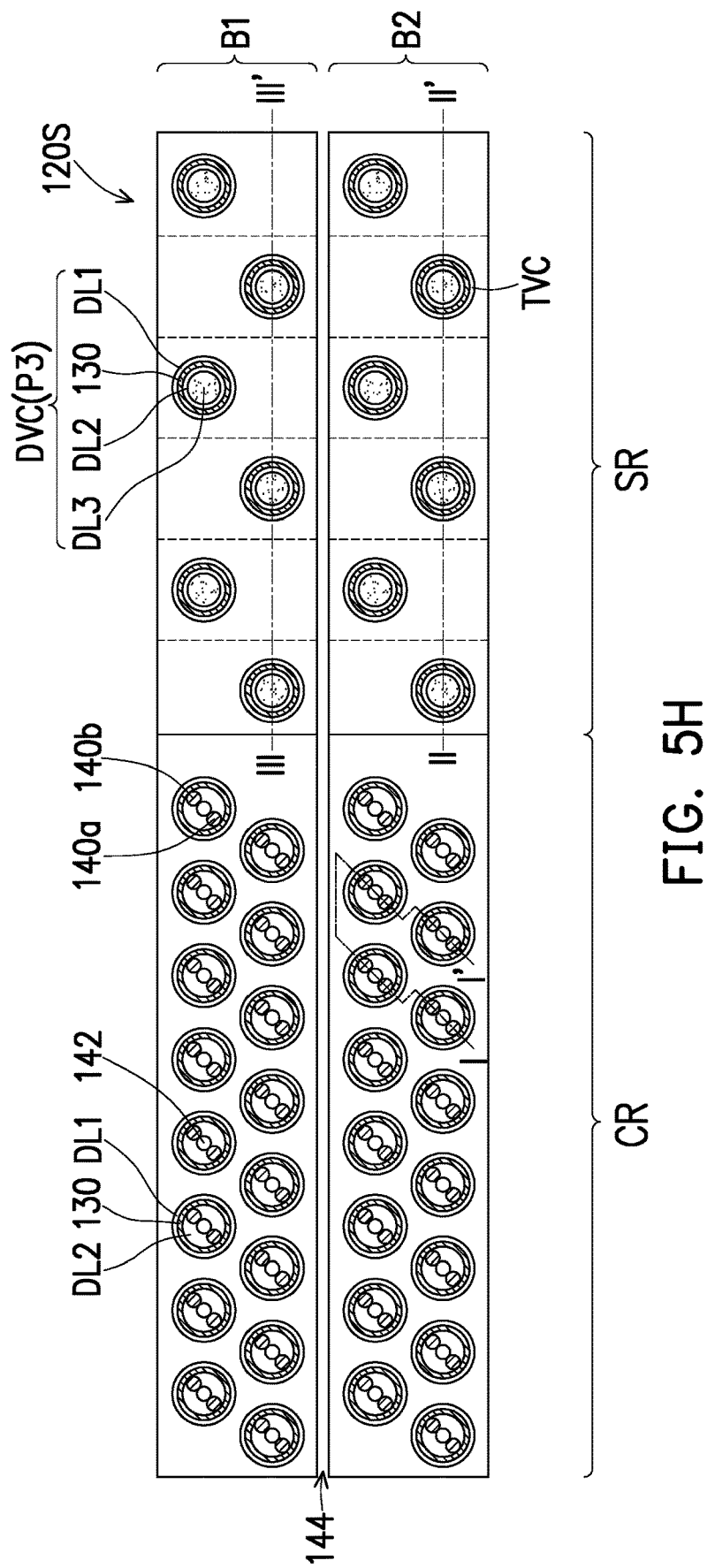
Figure 6H:
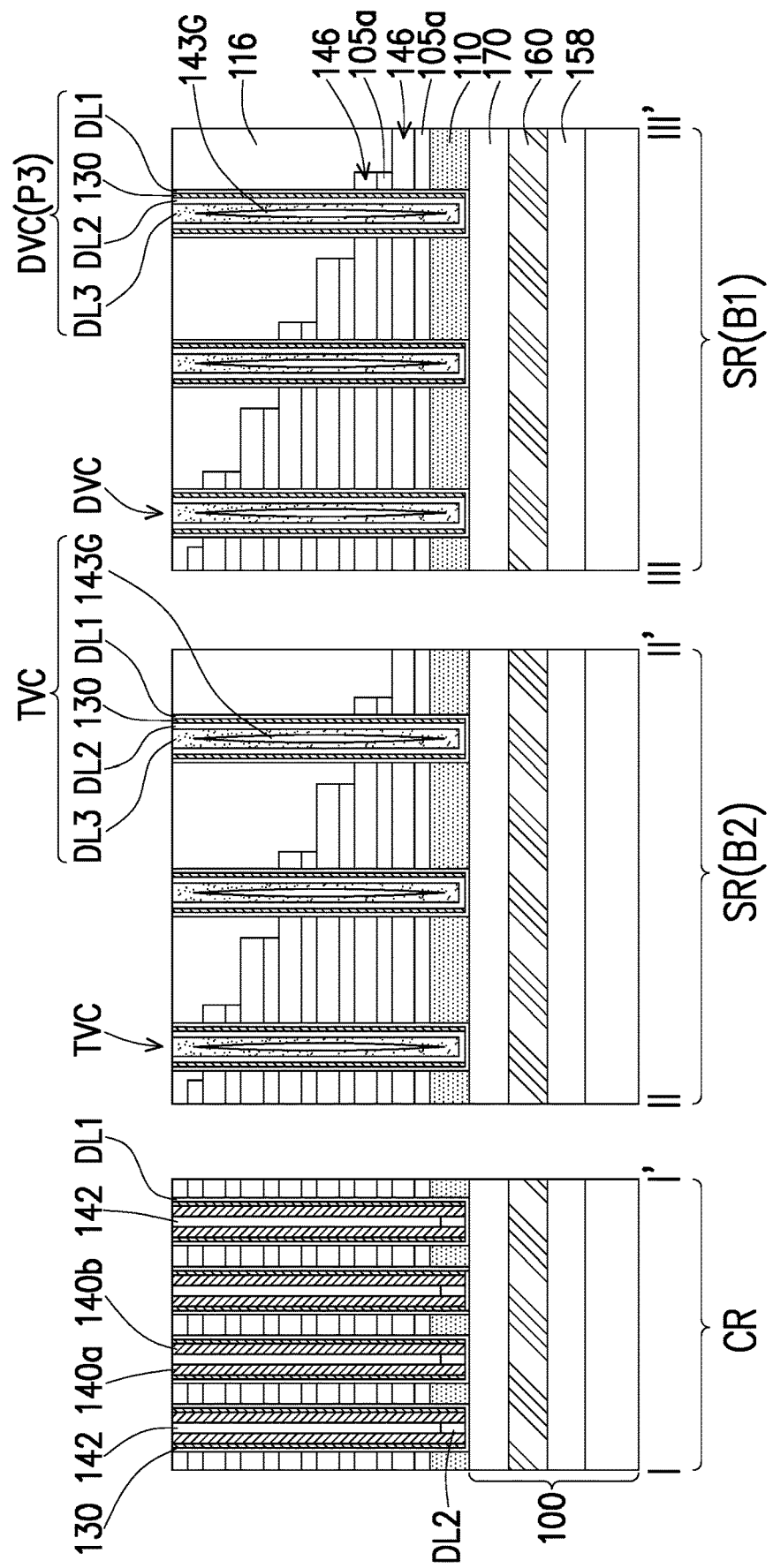

Then, referring to FIG. 5H and FIG. 6H, the sacrificial layers 105b in the patterned stack structure 115 are removed to form horizontal openings 146 between two adjacent insulating layers 105a. In some embodiments, the trench 144 may communicate with the horizontal openings 146. In some embodiments, the sacrificial layers 105b may be removed by using a hot phosphoric acid. In some embodiments, in the process of removing the sacrificial layers 105b in the patterned stack structure 115, the channel pillar 130, the dielectric layers DL1 and DL2, the source and drain pillars 140a and 140b, and the insulating pillar 142 in the cell region CR, and the channel pillar 130 and the dielectric layers DL1, DL2, and DL3 in the staircase region SR may serve as supporting pillars to maintain the stability of the structure. The area of the sacrificial layer 105b removed by the hot phosphoric acid is limited; namely, the sacrificial layer 105b adjacent to the trench 144 is removed, and the sacrificial layer 105b far away from the trench 144 is retained to form a part of the dummy gate stack structure DGS.

Figure 5I:
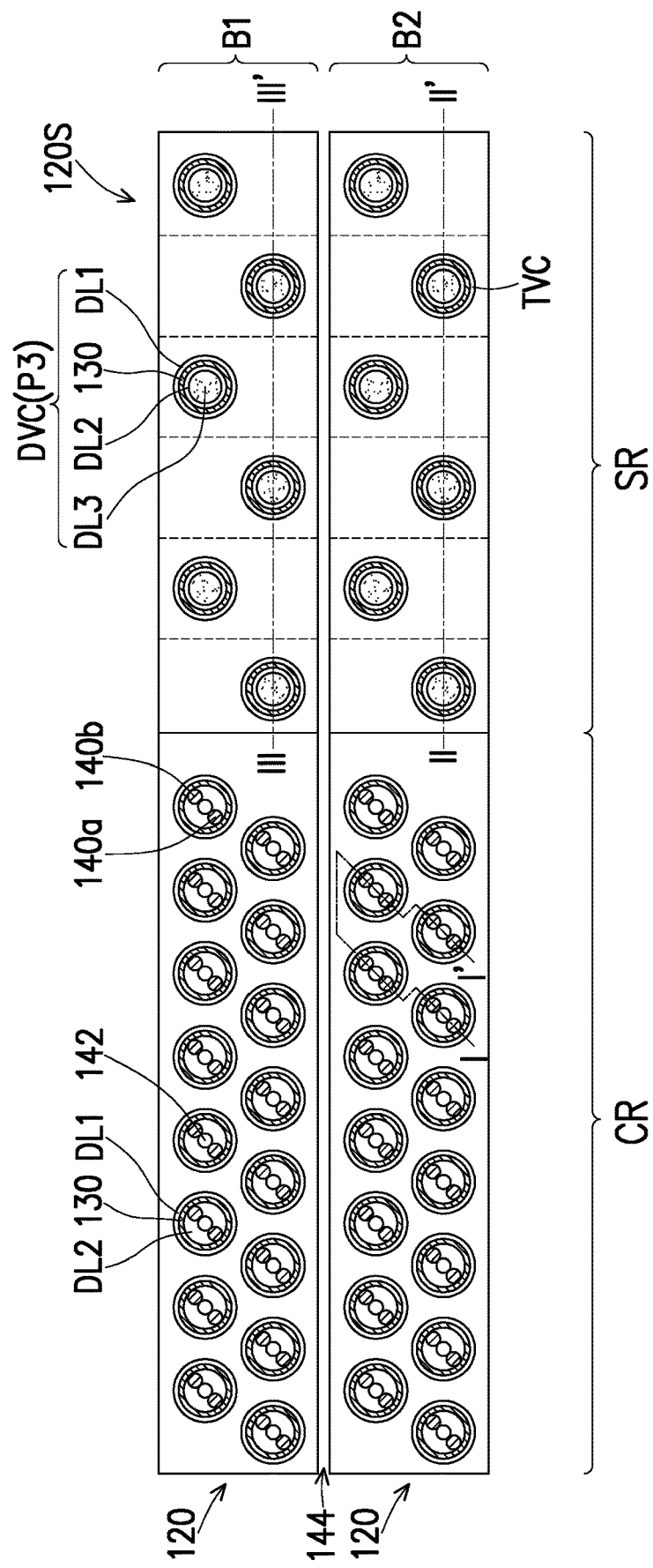
Figure 6I:
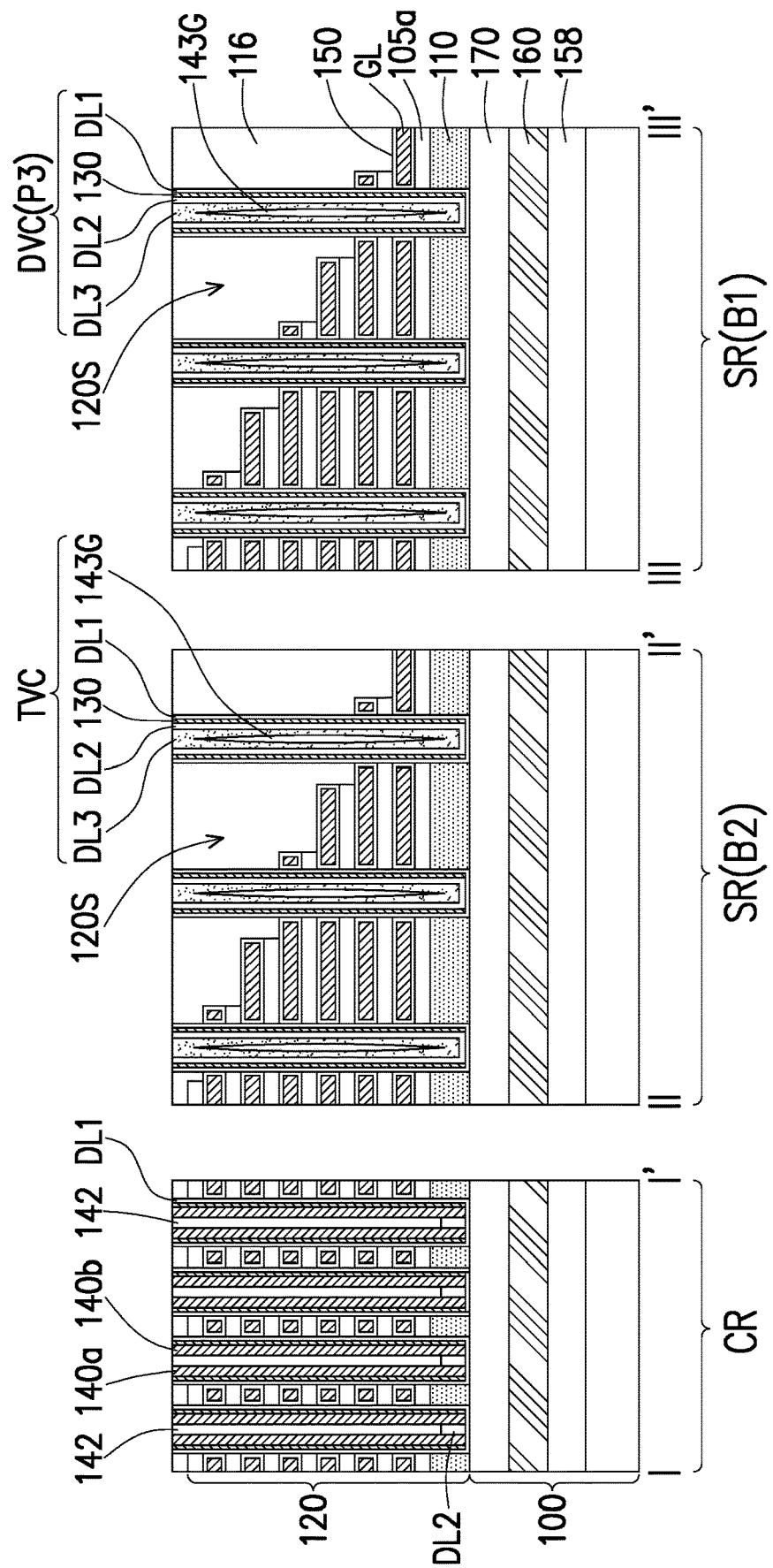

Afterwards, referring to FIG. 5I and FIG. 6I, a charge storage structure 150 and a gate layer GL are sequentially formed in the horizontal opening 146 to form a gate stack structure 120. The gate stack structure 120 includes a staircase structure 120S located in the staircase region SR. The charge storage structure 150 may be disposed between the gate layer GL and the corresponding channel pillar 130. In some embodiments, the charge storage structure 150 may be an oxide-nitride-oxide (ONO) composite layer. In the case where the dielectric layer DL1 can serve as an oxide layer adjacent to the channel in the ONO composite layer, a nitride layer and an oxide layer adjacent to the gate layer GL may be sequentially formed in the horizontal opening 146 to form the charge storage structure 150 between the channel pillar 130 and the gate layer GL. In this embodiment, the nitride layer and the oxide layer adjacent to the gate layer GL in the ONO composite layer may be located between the gate layer GL and the insulating layer 105a. In some embodiments, the charge storage structure 150 and the gate layer GL may be formed by the following steps. First, a charge storage material layer (not shown) is conformally formed on the surfaces of the horizontal opening 146 and the trench 144. The charge storage material layer does not fully fill the horizontal opening 146, but leaves the central portion of the horizontal opening 146 unfilled. Next, a gate material layer (not shown) is formed on the charge storage material layer. The gate material layer is filled in the central portion of the horizontal opening 146 and formed on the surface of the trench 144. Then, the charge storage material layer and the gate material layer on the surface of the trench 144 are removed by a process such as an anisotropic etch-back process to form the charge storage structure 150 and the gate layer GL in the horizontal opening 146.

Figure 5J:
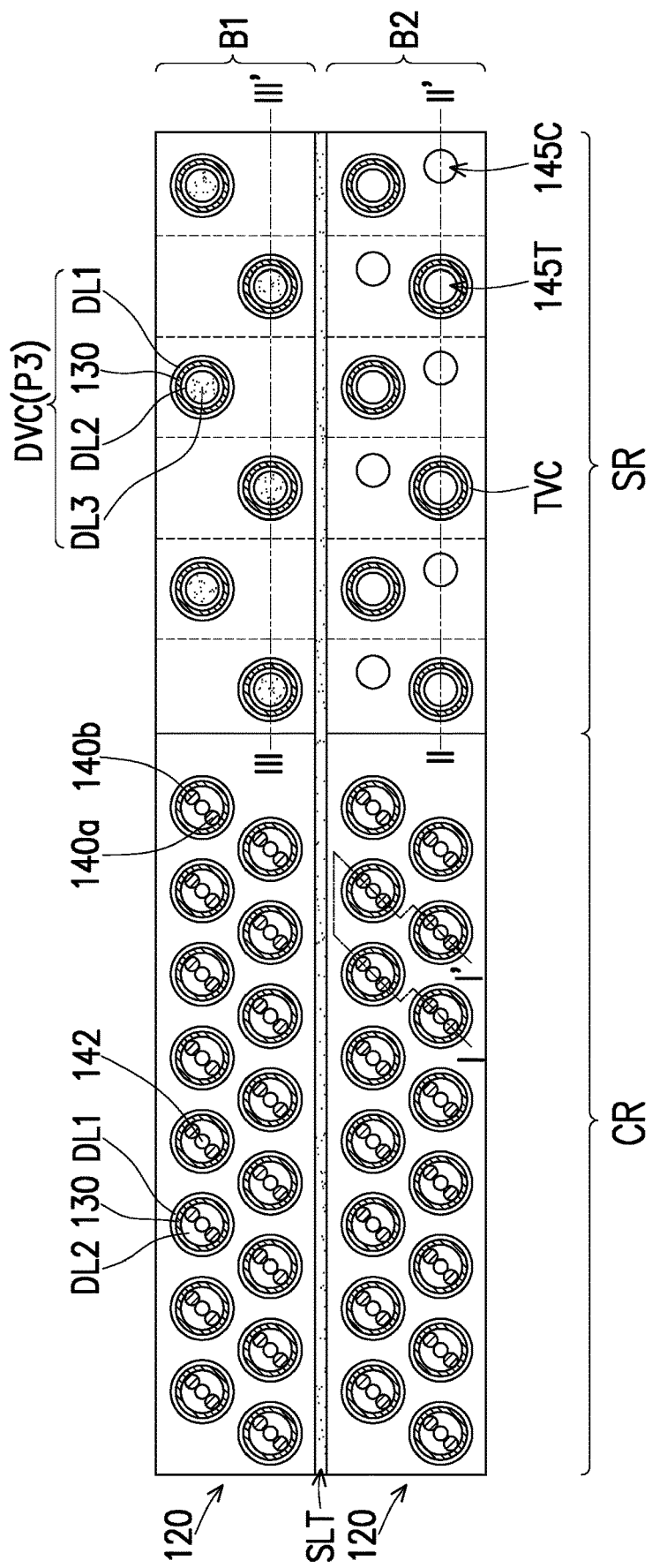
Figure 6J:
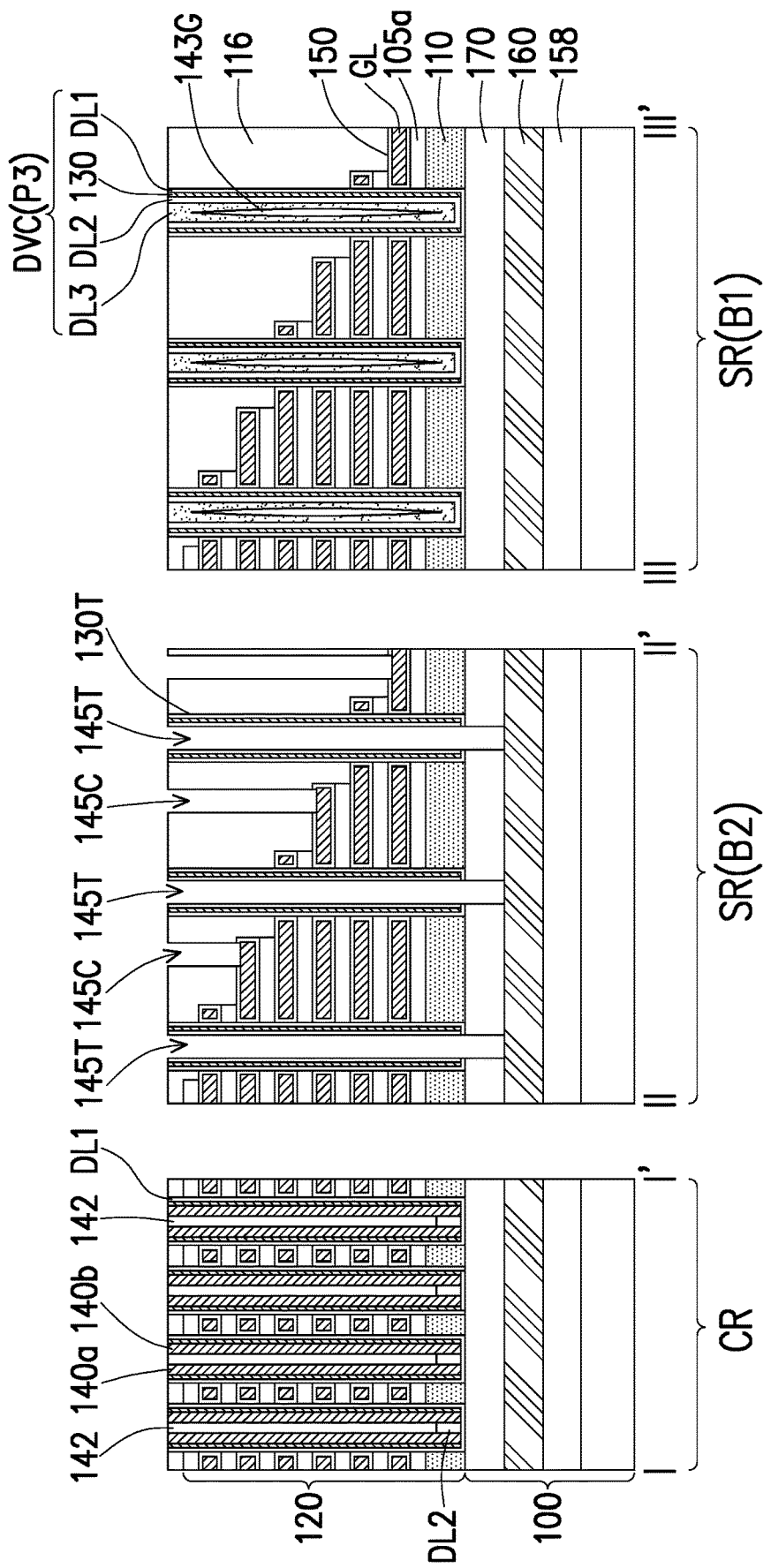

Next, referring to FIG. 5J and FIG. 6J, the trench 144 is filled with an insulating material to form a slit SLT. The slit SLT may fully fill the trench 144. In other words, the slit SLT may be located between two adjacent gate stack structures 120 and/or between the gate stack structure 120 and the dummy gate stack structure DGS.

Then, a patterning process is performed to define the sizes and positions of through-array vias TAV and contacts COA. Parts of the dielectric layer in the dummy pillars TVC are removed to form multiple openings 145T for the through-array vias TAV which extends to the conductive line 160, and multiple openings 145C for the contacts COA which extends to the gate layer GL. Since the dielectric layer DL3 does not fully fill the opening 130T but the gap 143G is left, compared with a dense dielectric without gaps, the etchant may flow into the gap 143G, and the process may be performed to remove the material of the dielectric layer DL3 in the opening 130T at a faster etching rate. The size and shape of the opening 130T may be designed according to the requirements of the manufacturing process, as long as the sidewall of the opening 130T is still covered by the dielectric layer DL2, or/and DL3, and the channel pillar 130 is not exposed. In some embodiments, the dielectric layer DL3 in the opening 130T is partially removed, and all of the dielectric layer DL2 and part of the dielectric layer DL3 are retained. In alternative embodiments, the dielectric layer DL3 in the opening 130T is completely removed, and the dielectric layer DL2 in the opening 130T is partially removed, and part of the dielectric layer DL2 is retained.

Figure 5K:
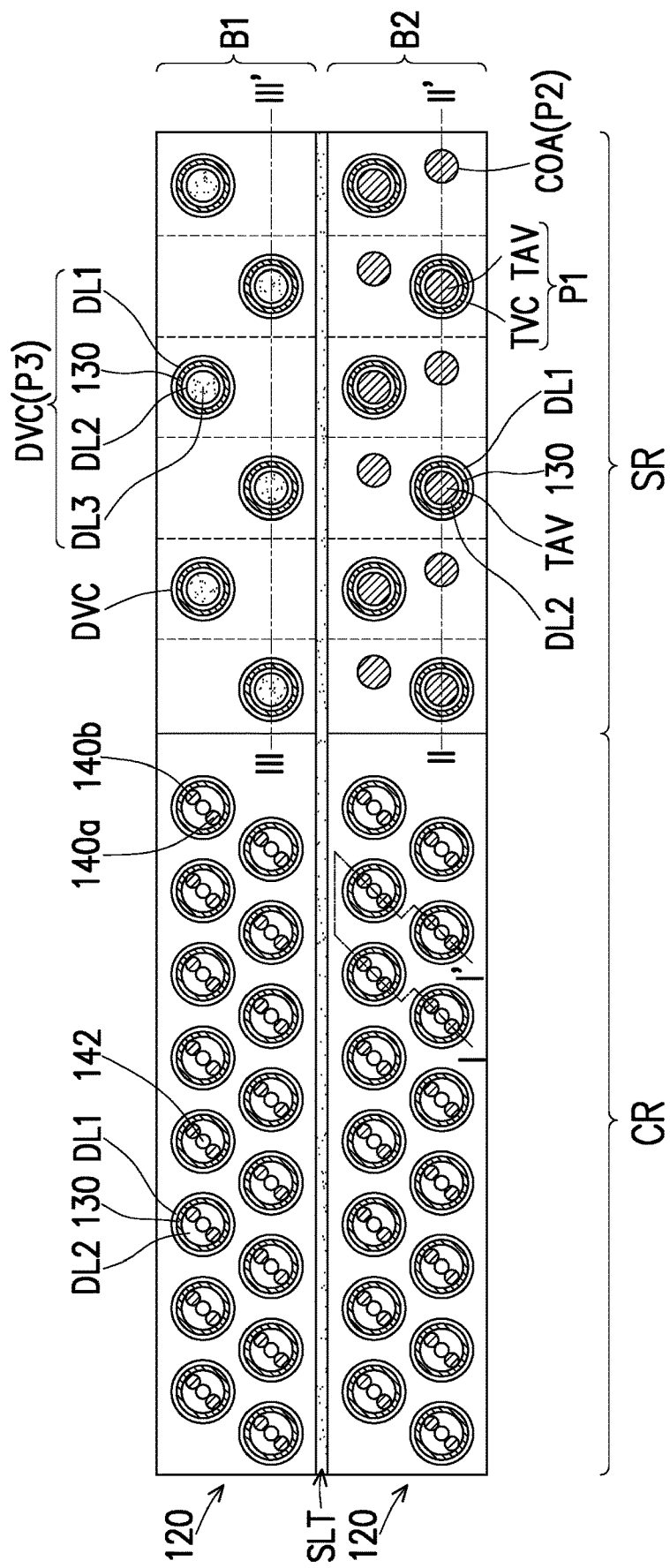
Figure 6K:
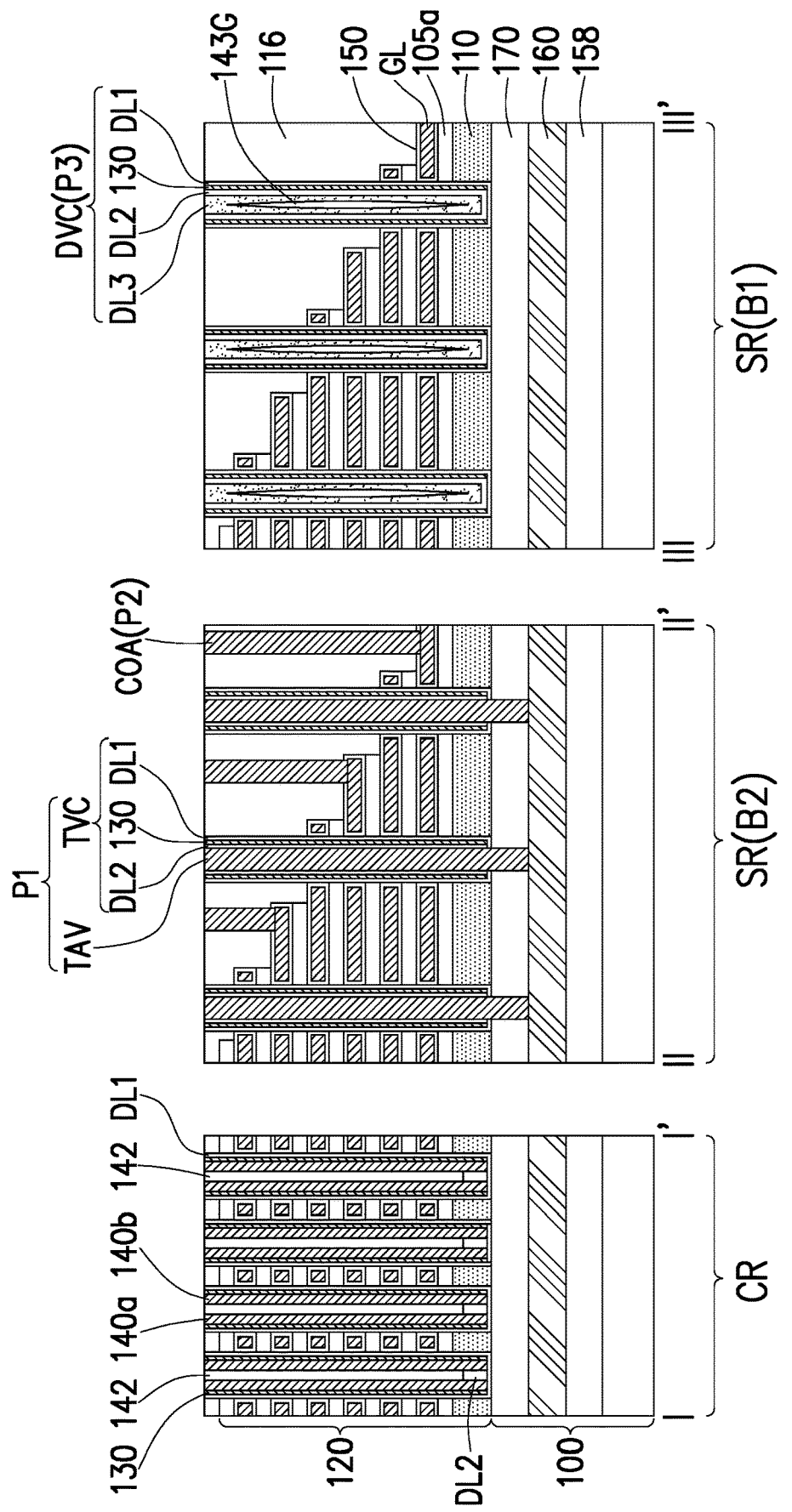

Next, referring to FIG. 5K and FIG. 6K, through-array vias TAV and contacts COA are formed in the openings 145T and 145C. The through-array via TAV penetrates through the gate stack structure 120 and the conductive layer 110 and extends into the substrate 100. The through-array via TAV is connected to the conductive line 160 in the substrate 100. Accordingly, plugs P1 include the through-array vias TAV and the dummy pillars TVC including the dielectric layers DL1 and DL2, and the channel pillar 130 may be formed. The contacts COA (or referred to as P2) are electrically connected to and land on the gate layer GL or the conductive layer 110 of each stair.

In summary of the above, in the embodiments of the disclosure, the contacts COA and the through-array vias TAV in the dummy pillars TVC within the same block in the staircase region may be arranged in a staggered pattern, or the contacts COA and the dummy pillars DVC in the same block in the staircase region may be arranged in a staggered pattern, so as to provide uniform support for the entire staircase structure. The dummy pillars DVC or the through-array vias TAV in the dummy pillars TVC may be individually disposed in another block in the staircase region; the dummy pillars DVC or the through-array vias TAV in the dummy pillars TVC may be arranged in a staggered pattern to provide uniform support for the entire staircase structure, or their radial dimension may be increased or their shape may be changed to improve the support effect for each stair.

What is claimed is:

1. A memory device comprising:
    a staircase structure comprising multiple gate layers and multiple insulating layers alternately stacked on each other, wherein the staircase structure comprises multiple first blocks and multiple second blocks which alternate with each other;
    multiple first plugs disposed in the multiple first blocks, wherein the multiple first plugs in a same first block are staggered with each other;
    multiple second plugs disposed in the multiple first blocks, wherein the multiple second plugs in a same first block are staggered with each other, and the multiple first plugs and the multiple second plugs in a same first block are staggered with each other; and
    multiple third plugs disposed in the multiple second blocks.

2. The memory device according to claim 1, wherein a radial dimension of the multiple second plugs is smaller than a radial dimension of the multiple first plugs and is smaller than a radial dimension of the multiple third plugs.

3. The memory device according to claim 1, wherein
    each of the multiple first plugs comprises:
        a first dummy pillar extending in the staircase structure; and
        a through array via extending in the first dummy pillar and electrically connected to a conductive layer below the staircase structure,
    the multiple second plugs respectively land on the gate layers of stairs of the staircase structure, and
    the multiple third plugs are multiple second dummy pillars extending in the staircase structure, and the multiple third plugs in a same second block are staggered with each other.

4. The memory device according to claim 3, wherein the multiple first plugs and the multiple third plugs in a same stair of the staircase structure are arranged in a column, and the multiple second plugs in a same stair of the staircase structure are arranged in another column.

5. The memory device according to claim 3, wherein each of the multiple first plugs and each of the multiple third plugs respectively extend through one stair of the staircase structure.

6. The memory device according to claim 3, wherein each of the multiple first plugs and each of the multiple third plugs respectively extend through two adjacent stairs of the staircase structure.

7. The memory device according to claim 1, wherein
    the multiple first plugs are multiple first dummy pillars which extend in the staircase structure and are electrically insulated from a conductive layer below the staircase structure,
    the multiple second plugs land on the gate layers of the staircase structure, and
    each of the multiple third plugs comprises:
        a second dummy pillar extending in the staircase structure; and
        a through array via extending in the staircase structure and connected to the conductive layer below the staircase structure.

8. The memory device according to claim 7, wherein the multiple third plugs and the multiple first plugs in a same stair of the staircase structure are arranged in a column, and the multiple second plugs in a same stair of the staircase structure are arranged in another column.

9. The memory device according to claim 8, wherein the multiple third plugs in a same second block are staggered with each other.

10. The memory device according to claim 8, wherein the multiple third plugs are arranged in an array, a shape of the multiple third plugs in a top view is different from a shape of the multiple first plugs in a top view, a radial dimension of the multiple third plugs is greater than a radial dimension of the multiple first plugs, or a combination thereof.

11. A flash memory device comprising:
a substrate comprising a memory cell region and a staircase region;
a stack structure located on the substrate, wherein the stack structure comprises multiple gate layers and multiple insulating layers alternately stacked on each other, the stack structure comprises a cell region and a staircase region, and the stack structure in the staircase region comprises a staircase structure;
multiple slits dividing the staircase structure into multiple first blocks and multiple second blocks which alternate with each other;
multiple channel pillars penetrating through the stack structure of the multiple first blocks and the multiple second blocks in the memory cell region;
multiple charge storage layers disposed between the multiple channel pillars and the gate layers;
multiple pairs of conductive pillars, each of the multiple pairs of conductive pillars comprising a first conductive pillar and a second conductive pillar which are electrically insulated from each other and are disposed in each of the channel pillars;
multiple first plugs disposed in the multiple first blocks, wherein the multiple first plugs in a same first block are staggered with each other;
multiple second plugs disposed in the multiple first blocks, wherein the multiple second plugs in a same first block are staggered with each other, and the multiple first plugs and the multiple second plugs in a same first block are staggered with each other; and
multiple third plugs disposed in the multiple second blocks.

12. The flash memory device according to claim 11, wherein a radial dimension of the multiple second plugs is smaller than a radial dimension of the multiple first plugs and is smaller than a radial dimension of the multiple third plugs.

13. The flash memory device according to claim 11, wherein
each of the multiple first plugs comprises:
a first dummy pillar extending in the staircase structure; and
a through array via extending in the first dummy pillar and electrically connected to a conductive layer below the staircase structure,
the multiple second plugs respectively land on the gate layers of stairs of the staircase structure, and
the multiple third plugs are multiple second dummy pillars extending in the staircase structure, and the multiple third plugs in a same second block are staggered with each other.

14. The flash memory device according to claim 13, wherein the multiple first plugs and the multiple third plugs in a same stair of the staircase structure are arranged in a column, and the multiple second plugs in a same stair of the staircase structure are arranged in another column.

15. The flash memory device according to claim 14, wherein each of the multiple first plugs and each of the multiple third plugs respectively extend through one stair of the staircase structure.

16. The flash memory device according to claim 14, wherein each of the multiple first plugs and each of the multiple third plugs respectively extend through two adjacent stairs of the staircase structure.

17. The flash memory device according to claim 11, wherein
the multiple first plugs are multiple first dummy pillars which extend in the staircase structure and are electrically insulated from a conductive layer below the staircase structure,
the multiple second plugs land on the gate layers of the staircase structure, and each of the multiple third plugs comprises:
a second dummy pillar extending in the staircase structure; and
a through array via extending in the staircase structure and connected to the conductive layer below the staircase structure.

18. The flash memory device according to claim 17, wherein the multiple third plugs and the multiple first plugs in a same stair of the staircase structure are arranged in a column, and the multiple second plugs in a same stair of the staircase structure are arranged in another column.

19. The flash memory device according to claim 18, wherein the multiple third plugs in a same second block are staggered with each other.

20. The flash memory device according to claim 18, wherein the multiple third plugs are arranged in an array, a shape of the multiple third plugs in a top view is different from a shape of the multiple first plugs in a top view, a radial dimension of the multiple third plugs is greater than a radial dimension of the first plugs, or a combination thereof.

* * * * *